United States Patent
Kim et al.

(10) Patent No.: US 11,012,983 B2
(45) Date of Patent: May 18, 2021

(54) METHOD FOR TRANSMITTING UPLINK CONTROL INFORMATION BY TERMINAL IN WIRELESS COMMUNICATION SYSTEM AND DEVICE FOR SUPPORTING SAME

(71) Applicant: LG Electronics Inc., Seoul (KR)

(72) Inventors: Seonwook Kim, Seoul (KR); Yunjung Yi, Seoul (KR); Joonkui Ahn, Seoul (KR); Hanbyul Seo, Seoul (KR); Suckchel Yang, Seoul (KR); Kijun Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/065,744

(22) PCT Filed: Jul. 26, 2017

(86) PCT No.: PCT/KR2017/008045
§ 371 (c)(1),
(2) Date: Dec. 3, 2018

(87) PCT Pub. No.: WO2018/021821
PCT Pub. Date: Feb. 1, 2018

(65) Prior Publication Data
US 2019/0141696 A1 May 9, 2019

Related U.S. Application Data

(60) Provisional application No. 62/367,081, filed on Jul. 26, 2016, provisional application No. 62/401,820, (Continued)

(51) Int. Cl.
*H04W 72/04* (2009.01)
*H04W 4/70* (2018.01)
(Continued)

(52) U.S. Cl.
CPC ....... *H04W 72/0413* (2013.01); *H04L 1/1819* (2013.01); *H04L 5/0048* (2013.01);
(Continued)

(58) Field of Classification Search
CPC .................. H04W 72/0413; H04L 5/0055
See application file for complete search history.

(56) References Cited

U.S. PATENT DOCUMENTS

| | | | |
|---|---|---|---|
| 2015/0124743 A1* | 5/2015 | Damnjanovic | H04L 5/0032 370/329 |
| 2016/0044606 A1* | 2/2016 | Yin | H04W 52/146 455/450 |

(Continued)

OTHER PUBLICATIONS

Samsung, "Co-existence scenarios for LTE and NR," 3GPP TSG-RAN WG2 Meeting #94, dated May 23-27, 2016, 6 pages (Year: 2016).*

(Continued)

*Primary Examiner* — Jamal Javaid
*Assistant Examiner* — Ryan C Kavleski
(74) *Attorney, Agent, or Firm* — Fish & Richardson P.C.

(57) ABSTRACT

Disclosed are a method for transmitting uplink control information by a terminal in a wireless communication system and a device for supporting the same. More particularly, disclosed are a method for transmitting, by a terminal, uplink control information corresponding to downlink signals received from two base stations communicating with (Continued)

the terminal by different schemes when the two base stations are connected with the terminal by a dual connectivity method, and a device for supporting the same.

14 Claims, 17 Drawing Sheets

Related U.S. Application Data filed on Sep. 29, 2016, provisional application No. 62/420,570, filed on Nov. 11, 2016, provisional application No. 62/454,874, filed on Feb. 5, 2017, provisional application No. 62/442,331, filed on Jan. 4, 2017, provisional application No. 62/447,311, filed on Jan. 17, 2017.

(51) Int. Cl.
*H04L 1/18* (2006.01)
*H04L 5/00* (2006.01)
*H04L 5/14* (2006.01)
*H03M 13/23* (2006.01)
*H03M 13/13* (2006.01)

(52) U.S. Cl.
CPC .......... *H04L 5/0055* (2013.01); *H04L 5/1469* (2013.01); *H04W 4/70* (2018.02); *H03M 13/136* (2013.01); *H03M 13/23* (2013.01)

(56) References Cited

U.S. PATENT DOCUMENTS

2017/0195978 A1* 7/2017 Lindholm ........... H04W 52/327
2017/0331577 A1* 11/2017 Parkvall ................ H04L 5/1469

OTHER PUBLICATIONS

Nokia et al., "Dual connectivity for LTE-NR tight interworking," 3GPP TSG-RAN WG2 Meeting #94, dated May 23-27, 2016, 3 pages (Year: 2016).*
International Search Report in International Application No. PCT/KR2017/008045, dated Nov. 22, 2017, 11 pages.
Samsung, "Co-existence scenarios for LTE and NR," 3GPP TSG-RAN WG2 Meeting #94, dated May 23-27, 2016, 6 pages.
Nokia et al., "Dual connectivity for LTE-NR tight interworking," 3GPP TSG-RAN WG2 Meeting #94, dated May 23-27, 2016, 3 pages.
Catt, "Control plane for support of tight interworking between 5G NR and LTE," 3GPP TSG RAN WG2 Meeting #94, dated May 23-27, 2016, 5 pages.
Samsung, "Co-existence of LTE and NR," 3GPP TSG RAN WG1 #85, dated May 23-27, 2016, 5 pages.

* cited by examiner

FIG. 14
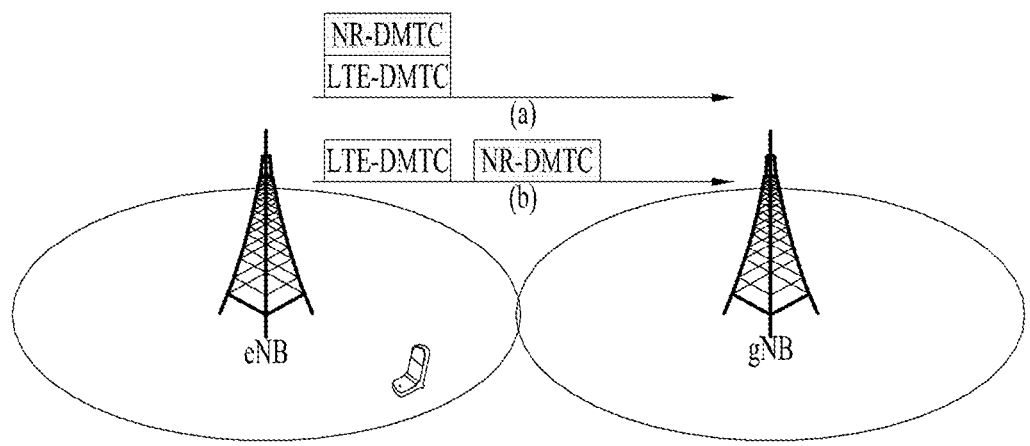
FIG. 15
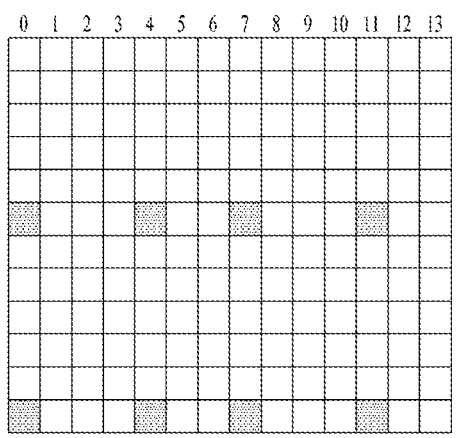
(a) LTE
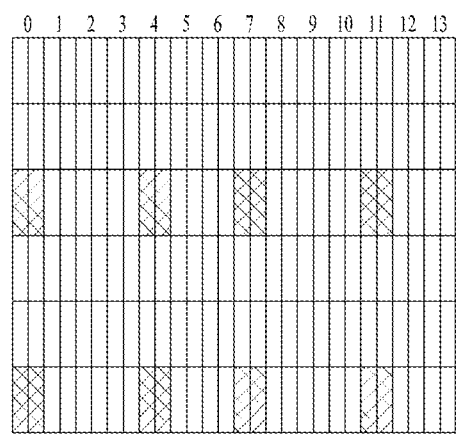
(a) NewRAT

METHOD FOR TRANSMITTING UPLINK CONTROL INFORMATION BY TERMINAL IN WIRELESS COMMUNICATION SYSTEM AND DEVICE FOR SUPPORTING SAME

CROSS-REFERENCE TO RELATED APPLICATIONS

This application is a National Stage application under 35 U.S.C. § 371 of International Application No. PCT/KR2017/008045, filed on Jul. 26, 2017, which claims the benefit of U.S. Provisional Application No. 62/454,874, filed on Feb. 5, 2017, U.S. Provisional Application No. 62/447,311, filed on Jan. 17, 2017, U.S. Provisional Application No. 62/442,331, filed on Jan. 4, 2017, U.S. Provisional Application No. 62/420,570, filed on Nov. 11, 2016, U.S. Provisional Application No. 62/401,820, filed on Sep. 29, 2016, and U.S. Provisional Application No. 62/367,081, filed on Jul. 26, 2016. The disclosures of the prior applications are incorporated by reference in their entirety.

TECHNICAL FIELD

The following description relates to a wireless communication system, and more particularly, to a method for transmitting uplink control information by a terminal in a wireless communication system and a device supporting the same.

More specifically, the following description includes a description of a method for transmitting, by a terminal, uplink control information corresponding to downlink signals received from two base stations when the two base stations which communicate using different schemes are connected to each other through dual connectivity, and a device supporting the same.

BACKGROUND ART

Wireless access systems have been widely deployed to provide various types of communication services such as voice or data. In general, a wireless access system is a multiple access system that supports communication of multiple users by sharing available system resources (a bandwidth, transmission power, etc.) among them. For example, multiple access systems include a Code Division Multiple Access (CDMA) system, a Frequency Division Multiple Access (FDMA) system, a Time Division Multiple Access (TDMA) system, an Orthogonal Frequency Division Multiple Access (OFDMA) system, and a Single Carrier Frequency Division Multiple Access (SC-FDMA) system.

As a number of communication devices have required higher communication capacity, the necessity of the mobile broadband communication much improved than the existing radio access technology (RAT) has increased. In addition, massive machine type communications (MTC) capable of providing various services at anytime and anywhere by connecting a number of devices or things to each other has been considered in the next generation communication system. Moreover, a communication system design capable of supporting services/UEs sensitive to reliability and latency has been discussed.

As described above, the introduction of the next generation RAT considering the enhanced mobile broadband communication, massive MTC, Ultra-reliable and low latency communication (URLLC), and the like has been discussed.

DISCLOSURE

Technical Problem

An object of the present invention devised to solve the problem lies in a method for transmitting uplink control information by a terminal in a newly proposed communication system.

In particular, it is an object of the present invention to provide a method for transmitting, by a terminal, uplink control information corresponding to a downlink signal received from each base station when a base station (e.g., an NR base station) according to a newly proposed communication system and a base station (e.g., an LTE base station) according to a legacy communication system coexist.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solution

The present invention provides a method and devices for transmitting and receiving uplink control information by a base station and a terminal in a wireless communication system. In particular, the present invention provides a method for transmitting, by a user equipment, uplink control information for two base stations (e.g., an LTE eNB and an NR gNB) when the two base stations have dual connectivity, and a device therefor.

In one aspect of the present invention, provided herein is a method for transmitting uplink control information by a user equipment in a wireless communication system including a first base station and a second base station connected to the first base station through dual connectivity, the method including receiving a first downlink signal from the first base station and a second downlink signal from the second base station, and transmitting first uplink control information corresponding to the first downlink signal and second uplink control information corresponding to the second downlink signal using a carrier shared by the first base station and the second base station.

In another aspect of the present invention, provided herein is a user equipment for transmitting uplink control information in a wireless communication system including a first base station and a second base station connected to the first base station through dual connectivity, the user equipment including a transmitter, a receiver, and a processor connected to the transmitter and the receiver to operate, wherein the processor is configured to receive a first downlink signal from the first base station and a second downlink signal from the second base station, and transmit first uplink control information corresponding to the first downlink signal and second uplink control information corresponding to the second downlink signal using a carrier shared by the first base station and the second base station.

In one example, a time interval for transmitting the first uplink control information and a time interval for transmitting the second uplink control information may be time division multiplexed (TDMed).

In this case, the user equipment may receive information on a time interval being capable for transmitting the first uplink control information and a time interval being capable for transmitting the second uplink control information, through first layer signaling or higher layer signaling.

Herein, the first uplink control information may be transmitted in an earliest time interval after a predetermined time from a time point when the first downlink signal is received in the time interval being capable for transmitting the first uplink control information.

In another example, a frequency band in which the first uplink control information is transmitted and a frequency band in which the second uplink control information is transmitted may be frequency division multiplexed (FDMed).

In this case, the transmitting of the first uplink control information corresponding to the first downlink signal and the second uplink control information corresponding to the second downlink signal include determining a first Physical Uplink Control Channel (PUCCH) format and a first PUCCH resource for transmitting the first uplink control information and determining a second PUCCH format and a second PUCCH resource for transmitting the second uplink control information, and transmitting the first uplink control information using the first PUCCH format and the first PUCCH resource and transmitting the second uplink control information using the second PUCCH format and the second PUCCH resource.

In another example, the first uplink control information and the second uplink control information may be transmitted through the same Physical Uplink Control Channel (PUCCH) resource.

In this case, when a sum of bit sizes of the first uplink control information and the second uplink control information is less than or equal to 22 bits, the first uplink control information and the second uplink control information may be transmitted using PUCCH format 3, by applying Reed-Muller (RM) coding thereto. Herein, an input bit stream of the PUCCH format 3 may be configured by arranging the first uplink control information before or after the second uplink control information in a time dimension.

Alternatively, when a sum of bit sizes of the first uplink control information and the second uplink control information is greater than 22 bits, the first uplink control information and the second uplink control information may be transmitted by applying tail biting convolutional coding (TBCC) thereto.

In another example, when the first uplink control information and the second uplink control information are transmitted in a time interval in which simultaneous transmission of a Physical Uplink Control Channel (PUCCH) and a Physical Uplink Shared Channel (PUSCH) is configured, the first uplink control information and the second uplink control information may be transmitted by being piggybacked on the PUSCH according to different mapping rules.

In another example, when the first uplink control information and the second uplink control information are transmitted in a time interval in which simultaneous transmission of a PUCCH and a PUSCH is configured, the first uplink control information may be transmitted on the PUCCH and the second uplink control information may be transmitted by being piggybacked on the PUSCH.

Herein, the first base station may be a New RAT (NR) base station and the second base station may be a Long Term Evolution (LTE) base station. Herein, the NR base station may operate in time division duplex (TDD), and the LTE base station may operate in frequency division duplex (FDD).

In addition, the first base station may be connected to the second base station through a non-ideal backhaul.

It is to be understood that both the foregoing general description and the following detailed description of the present disclosure are exemplary and explanatory and are intended to provide further explanation of the disclosure as claimed.

Advantageous Effects

As is apparent from the above description, the embodiments of the present disclosure have the following effects.

According to the present invention, when a base station (e.g., an NR base station) according to a newly proposed communication system and a base station (e.g., an LTE base station) according to a legacy communication system coexist, a method for transmitting uplink control information by a user equipment may be specifically proposed.

In particular, according to the present invention, when an NR base station according to the NR system and an LTE base station according to the LTE system coexist, a user equipment may transmit uplink control information about the NR base station to the LTE base station which is dual-connected with the NR base station, based on the characteristics of the NR base station operating in TDD and the LTE base station operating in FDD. Accordingly, both the NR base station and the LTE base station may more usefully utilize resources.

The effects that can be achieved through the embodiments of the present invention are not limited to what has been particularly described hereinabove and other effects which are not described herein can be derived by those skilled in the art from the following detailed description. That is, it should be noted that the effects which are not intended by the present invention can be derived by those skilled in the art from the embodiments of the present invention.

DESCRIPTION OF DRAWINGS

The accompanying drawings, which are included to provide a further understanding of the invention, provide embodiments of the present invention together with detail explanation. Yet, a technical characteristic of the present invention is not limited to a specific drawing. Characteristics disclosed in each of the drawings are combined with each other to configure a new embodiment. Reference numerals in each drawing correspond to structural elements.

FIG. 14 is a diagram schematically illustrating an example of configuration of an LTE-DMTC and an NR-DMTC in a scenario where an eNB and a gNB are non-co-located according to the present invention;

FIG. 15 is a diagram illustrating a signal transmitted from an NR system according to an embodiment of the present invention;

BEST MODE

Figure 1:
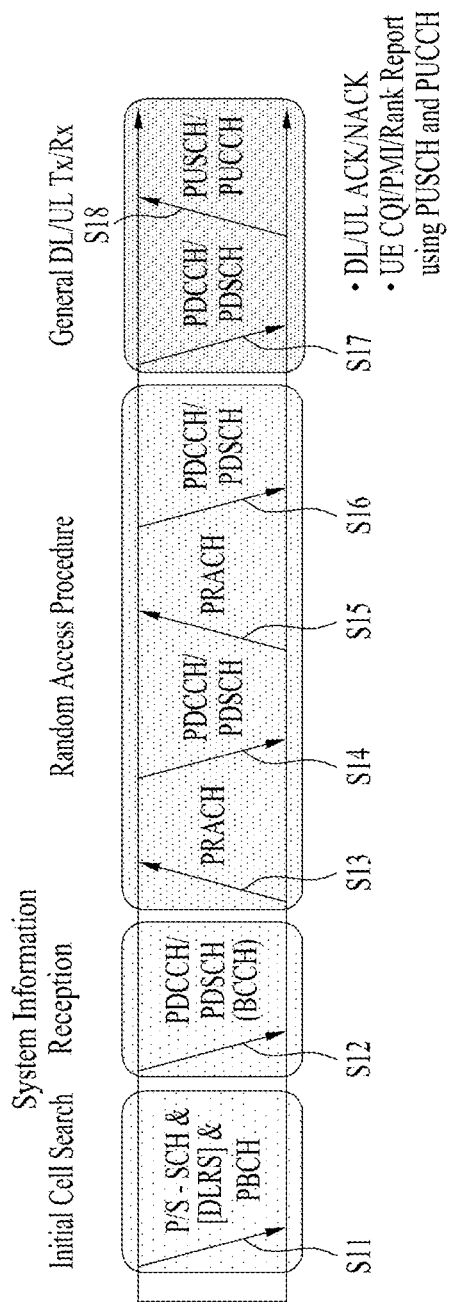
FIG. 1 is a diagram illustrating physical channels and a signal transmission method using the physical channels.

The embodiments of the present disclosure described below are combinations of elements and features of the present disclosure in specific forms. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions or elements of any one embodiment may be included in another embodiment and may be replaced with corresponding constructions or features of another embodiment.

In the description of the attached drawings, a detailed description of known procedures or steps of the present disclosure will be avoided lest it should obscure the subject matter of the present disclosure. In addition, procedures or steps that could be understood to those skilled in the art will not be described either.

Throughout the specification, when a certain portion "includes" or "comprises" a certain component, this indicates that other components are not excluded and may be further included unless otherwise noted. The terms "unit", "-or/er" and "module" described in the specification indicate a unit for processing at least one function or operation, which may be implemented by hardware, software or a combination thereof. In addition, the terms "a or an", "one", "the" etc. may include a singular representation and a plural representation in the context of the present disclosure (more particularly, in the context of the following claims) unless indicated otherwise in the specification or unless context clearly indicates otherwise.

In the embodiments of the present disclosure, a description is mainly made of a data transmission and reception relationship between a Base Station (BS) and a User Equipment (UE). A BS refers to a terminal node of a network, which directly communicates with a UE. A specific operation described as being performed by the BS may be performed by an upper node of the BS.

Namely, it is apparent that, in a network comprised of a plurality of network nodes including a BS, various operations performed for communication with a UE may be performed by the BS, or network nodes other than the BS. The term 'BS' may be replaced with a fixed station, a Node B, an evolved Node B (eNode B or eNB), an Advanced Base Station (ABS), an access point, etc.

In the embodiments of the present disclosure, the term terminal may be replaced with a UE, a Mobile Station (MS), a Subscriber Station (SS), a Mobile Subscriber Station (MSS), a mobile terminal, an Advanced Mobile Station (AMS), etc.

A transmission end is a fixed and/or mobile node that provides a data service or a voice service and a reception end is a fixed and/or mobile node that receives a data service or a voice service. Therefore, a UE may serve as a transmission end and a BS may serve as a reception end, on an UpLink (UL). Likewise, the UE may serve as a reception end and the BS may serve as a transmission end, on a DownLink (DL).

The embodiments of the present disclosure may be supported by standard specifications disclosed for at least one of wireless access systems including an Institute of Electrical and Electronics Engineers (IEEE) 802.xx system, a 3rd Generation Partnership Project (3GPP) system, a 3GPP Long Term Evolution (LTE) system, and a 3GPP2 system. In particular, the embodiments of the present disclosure may be supported by the standard specifications, 3GPP TS 36.211, 3GPP TS 36.212, 3GPP TS 36.213, 3GPP TS 36.321 and 3GPP TS 36.331. That is, the steps or parts, which are not described to clearly reveal the technical idea of the present disclosure, in the embodiments of the present disclosure may be explained by the above standard specifications. All terms used in the embodiments of the present disclosure may be explained by the standard specifications.

Reference will now be made in detail to the embodiments of the present disclosure with reference to the accompanying drawings. The detailed description, which will be given below with reference to the accompanying drawings, is intended to explain exemplary embodiments of the present disclosure, rather than to show the only embodiments that can be implemented according to the disclosure.

The following detailed description includes specific terms in order to provide a thorough understanding of the present disclosure. However, it will be apparent to those skilled in the art that the specific terms may be replaced with other terms without departing the technical spirit and scope of the present disclosure.

For example, the term, TxOP may be used interchangeably with transmission period or Reserved Resource Period (RRP) in the same sense. Further, a Listen-Before-Talk (LBT) procedure may be performed for the same purpose as a carrier sensing procedure for determining whether a channel state is idle or busy, CCA (Clear Channel Assessment), CAP (Channel Access Procedure).

Hereinafter, 3GPP LTE/LTE-A systems are explained, which are examples of wireless access systems.

The embodiments of the present disclosure can be applied to various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc.

CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc.

UTRA is a part of Universal Mobile Telecommunications System (UMTS). 3GPP LTE is a part of Evolved UMTS (E-UMTS) using E-UTRA, adopting OFDMA for DL and SC-FDMA for UL. LTE-Advanced (LTE-A) is an evolution of 3GPP LTE. While the embodiments of the present disclosure are described in the context of a 3GPP LTE/LTE-A system in order to clarify the technical features of the present disclosure, the present disclosure is also applicable to an IEEE 802.16e/m system, etc.

1. 3GPP LTE/LTE-A System 1.1. Physical Channels and Signal Transmission and Reception Method Using the Same In a wireless access system, a UE receives information from an eNB on a DL and transmits information to the eNB on a UL. The information transmitted and received between the UE and the eNB includes general data information and various types of control information. There are many physical channels according to the types/usages of information transmitted and received between the eNB and the UE.

FIG. 1 illustrates physical channels and a general signal transmission method using the physical channels, which may be used in embodiments of the present disclosure.

When a UE is powered on or enters a new cell, the UE performs initial cell search (S11). The initial cell search involves acquisition of synchronization to an eNB. Specifically, the UE synchronizes its timing to the eNB and acquires information such as a cell Identifier (ID) by receiving a Primary Synchronization Channel (P-SCH) and a Secondary Synchronization Channel (S-SCH) from the eNB.

Then the UE may acquire information broadcast in the cell by receiving a Physical Broadcast Channel (PBCH) from the eNB.

During the initial cell search, the UE may monitor a DL channel state by receiving a Downlink Reference Signal (DL RS).

After the initial cell search, the UE may acquire more detailed system information by receiving a Physical Downlink Control Channel (PDCCH) and receiving a Physical Downlink Shared Channel (PDSCH) based on information of the PDCCH (S12).

To complete connection to the eNB, the UE may perform a random access procedure with the eNB (S13 to S16). In the random access procedure, the UE may transmit a preamble on a Physical Random Access Channel (PRACH) (S13) and may receive a PDCCH and a PDSCH associated with the PDCCH (S14). In the case of contention-based random access, the UE may additionally perform a contention resolution procedure including transmission of an additional PRACH (S15) and reception of a PDCCH signal and a PDSCH signal corresponding to the PDCCH signal (S16).

After the above procedure, the UE may receive a PDCCH and/or a PDSCH from the eNB (S17) and transmit a Physical Uplink Shared Channel (PUSCH) and/or a Physical Uplink Control Channel (PUCCH) to the eNB (S18), in a general UL/DL signal transmission procedure.

Control information that the UE transmits to the eNB is generically called Uplink Control Information (UCI). The UCI includes a Hybrid Automatic Repeat and reQuest Acknowledgement/Negative Acknowledgement (HARQ-ACK/NACK), a Scheduling Request (SR), a Channel Quality Indicator (CQI), a Precoding Matrix Index (PMI), a Rank Indicator (RI), etc.

In the LTE system, UCI is generally transmitted on a PUCCH periodically. However, if control information and traffic data should be transmitted simultaneously, the control information and traffic data may be transmitted on a PUSCH. In addition, the UCI may be transmitted aperiodically on the PUSCH, upon receipt of a request/command from a network.

1.2. Resource Structure

Figure 2:
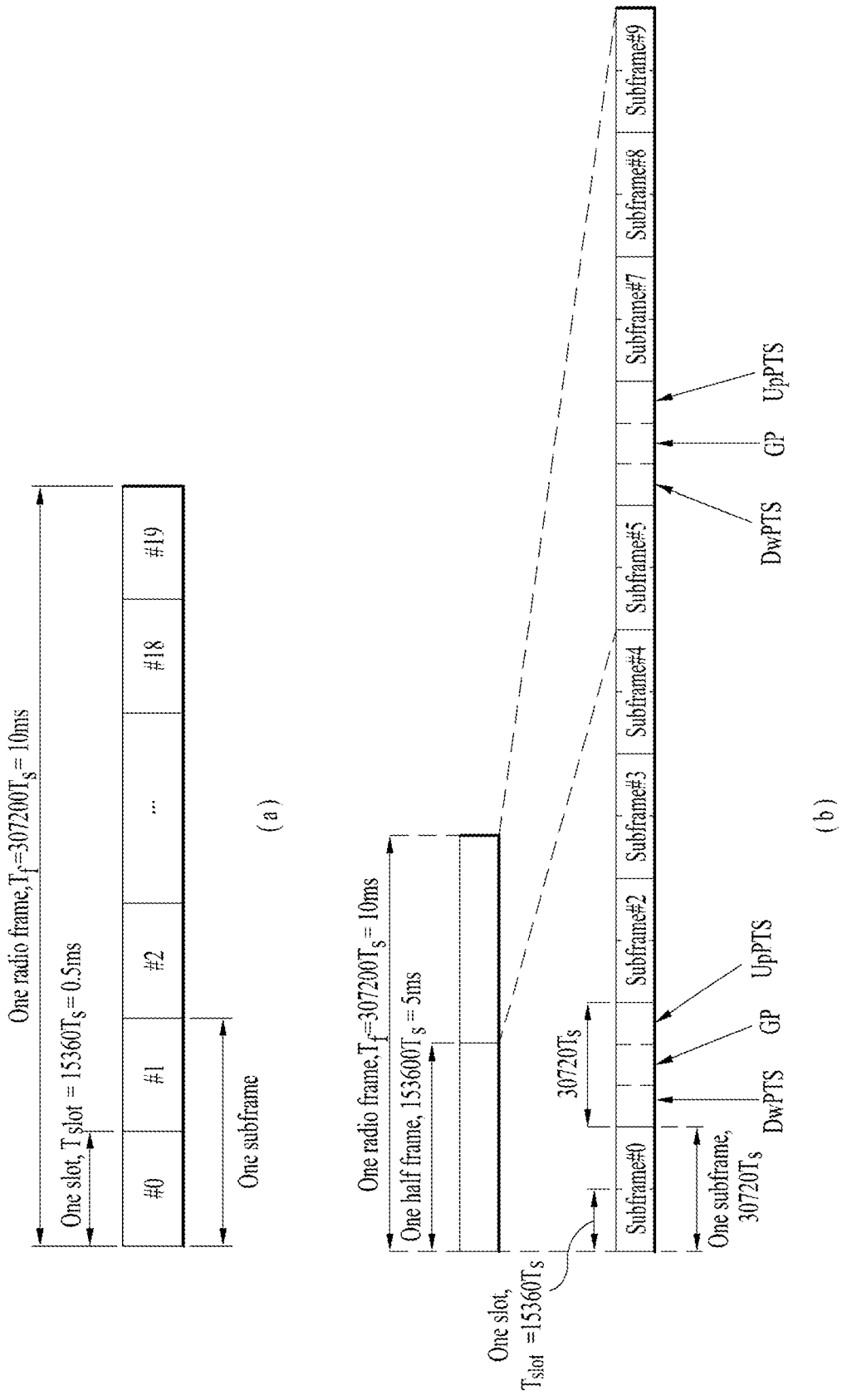
FIG. 2 is a diagram illustrating exemplary radio frame structures.

FIG. 2 illustrates exemplary radio frame structures used in embodiments of the present disclosure.

FIG. 2($a$) illustrates frame structure type 1. Frame structure type 1 is applicable to both a full Frequency Division Duplex (FDD) system and a half FDD system.

One radio frame is 10 ms (Tf=307200·Ts) long, including equal-sized 20 slots indexed from 0 to 19. Each slot is 0.5 ms (Tslot=15360·Ts) long. One subframe includes two successive slots. An ith subframe includes 2ith and (2i+1)th slots. That is, a radio frame includes 10 subframes. A time required for transmitting one subframe is defined as a Transmission Time Interval (TTI). Ts is a sampling time given as Ts=1/(15 kHz×2048)=3.2552×10−8 (about 33 ns). One slot includes a plurality of Orthogonal Frequency Division Multiplexing (OFDM) symbols or SC-FDMA symbols in the time domain by a plurality of Resource Blocks (RBs) in the frequency domain.

A slot includes a plurality of OFDM symbols in the time domain. Since OFDMA is adopted for DL in the 3GPP LTE system, one OFDM symbol represents one symbol period. An OFDM symbol may be called an SC-FDMA symbol or symbol period. An RB is a resource allocation unit including a plurality of contiguous subcarriers in one slot.

In a full FDD system, each of 10 subframes may be used simultaneously for DL transmission and UL transmission during a 10-ms duration. The DL transmission and the UL transmission are distinguished by frequency. On the other hand, a UE cannot perform transmission and reception simultaneously in a half FDD system.

The above radio frame structure is purely exemplary. Thus, the number of subframes in a radio frame, the number of slots in a subframe, and the number of OFDM symbols in a slot may be changed.

FIG. 2($b$) illustrates frame structure type 2. Frame structure type 2 is applied to a Time Division Duplex (TDD) system. One radio frame is 10 ms (Tf=307200·Ts) long, including two half-frames each having a length of 5 ms (=153600·Ts) long. Each half-frame includes five subframes each being 1 ms (=30720·Ts) long. An ith subframe includes 2ith and (2i+1)th slots each having a length of 0.5 ms (Tslot=15360·Ts). Ts is a sampling time given as Ts=1/(15 kHz×2048)=3.2552×10−8 (about 33 ns).

A type-2 frame includes a special subframe having three fields, Downlink Pilot Time Slot (DwPTS), Guard Period (GP), and Uplink Pilot Time Slot (UpPTS). The DwPTS is used for initial cell search, synchronization, or channel estimation at a UE, and the UpPTS is used for channel estimation and UL transmission synchronization with a UE at an eNB. The GP is used to cancel UL interference between a UL and a DL, caused by the multi-path delay of a DL signal.

Table 1 below lists special subframe configurations (DwPTS/GP/UpPTS lengths).

The PCFICH is transmitted in the first OFDM symbol of a subframe, carrying information about the number of OFDM symbols used for transmission of control channels (i.e., the size of the control region) in the subframe. The PHICH is a response channel to a UL transmission, delivering an HARQ ACK/NACK signal. Control information carried on the PDCCH is called Downlink Control Information (DCI). The DCI transports UL resource assignment information, DL resource assignment information, or UL Transmission (Tx) power control commands for a UE group.

1.3. CSI Feedback

In the 3GPP LTE or LTE-A system, user equipment (UE) has been defined to report channel state information (CSI) to

TABLE 1

| | Normal cyclic prefix in downlink | | | Extended cyclic prefix in downlink | | |
|---|---|---|---|---|---|---|
| | | UpPTS | | | UpPTS | |
| Special subframe configuration | DwPTS | Normal cyclic prefix in uplink | Extended cyclic prefix in uplink | DwPTS | Normal cyclic prefix in uplink | Extended cyclic prefix in uplink |
| 0 | 6592 · $T_s$ | 2192 · $T_s$ | 2560 · $T_s$ | 7680 · $T_s$ | 2192 · $T_s$ | 2560 · $T_s$ |
| 1 | 19760 · $T_s$ | | | 20480 · $T_s$ | | |
| 2 | 21952 · $T_s$ | | | 23040 · $T_s$ | | |
| 3 | 24144 · $T_s$ | | | 25600 · $T_s$ | | |
| 4 | 26336 · $T_s$ | | | 7680 · $T_s$ | 4384 · $T_s$ | 5120 · $T_s$ |
| 5 | 6592 · $T_s$ | 4384 · $T_s$ | 5120 · $T_s$ | 20480 · $T_s$ | | |
| 6 | 19760 · $T_s$ | | | 23040 · $T_s$ | | |
| 7 | 21952 · $T_s$ | | | — | — | — |
| 8 | 24144 · $T_s$ | | | — | — | — |

Figure 3:
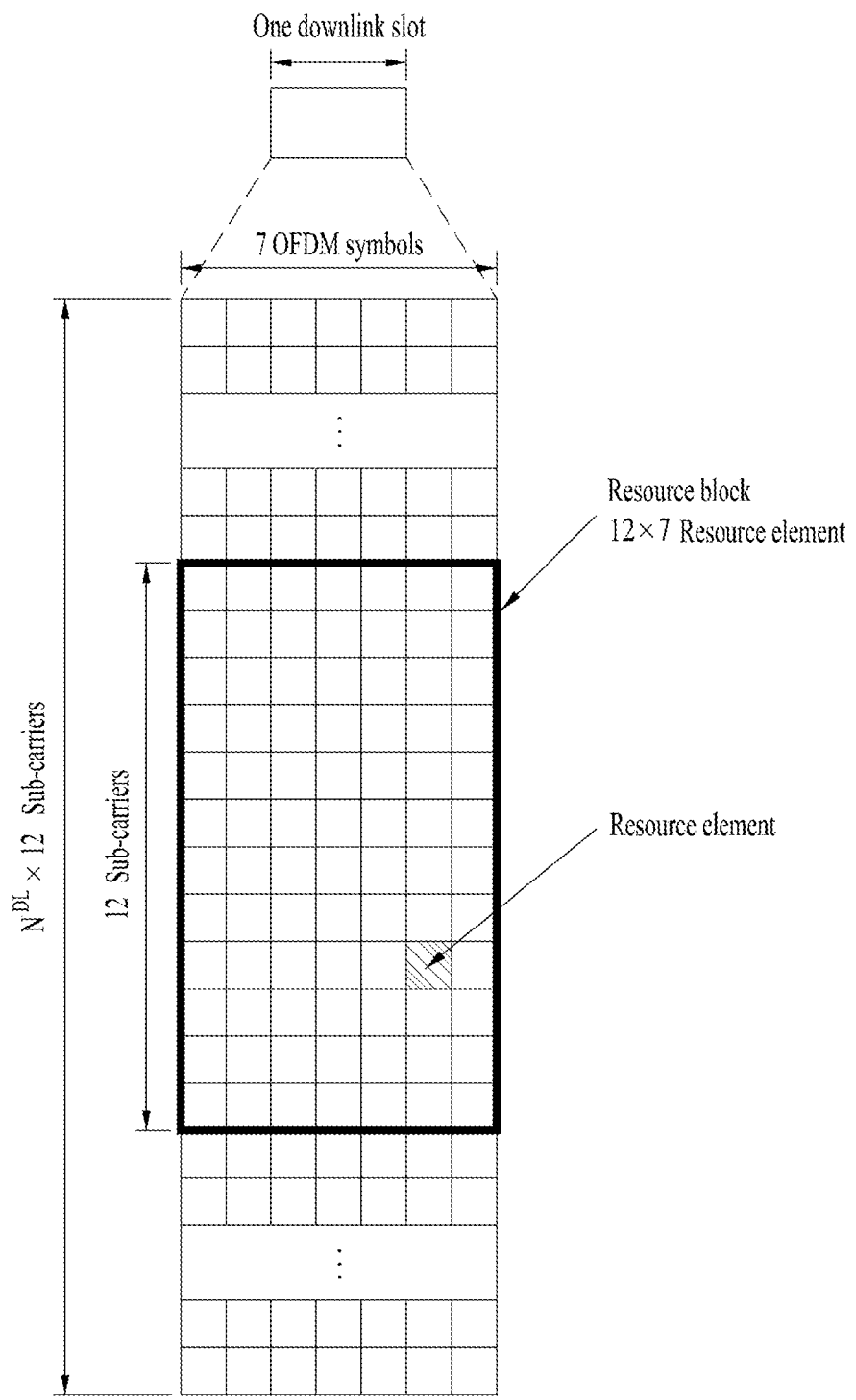
FIG. 3 is a diagram illustrating an exemplary resource grid for the duration of a downlink slot.

FIG. 3 illustrates an exemplary structure of a DL resource grid for the duration of one DL slot, which may be used in embodiments of the present disclosure.

Referring to FIG. 3, a DL slot includes a plurality of OFDM symbols in the time domain. One DL slot includes 7 OFDM symbols in the time domain and an RB includes 12 subcarriers in the frequency domain, to which the present disclosure is not limited.

Each element of the resource grid is referred to as a Resource Element (RE). An RB includes 12×7 REs. The number of RBs in a DL slot, NDL depends on a DL transmission bandwidth. The structure of the uplink slot may be the same as the structure of the downlink slot.

Figure 4:
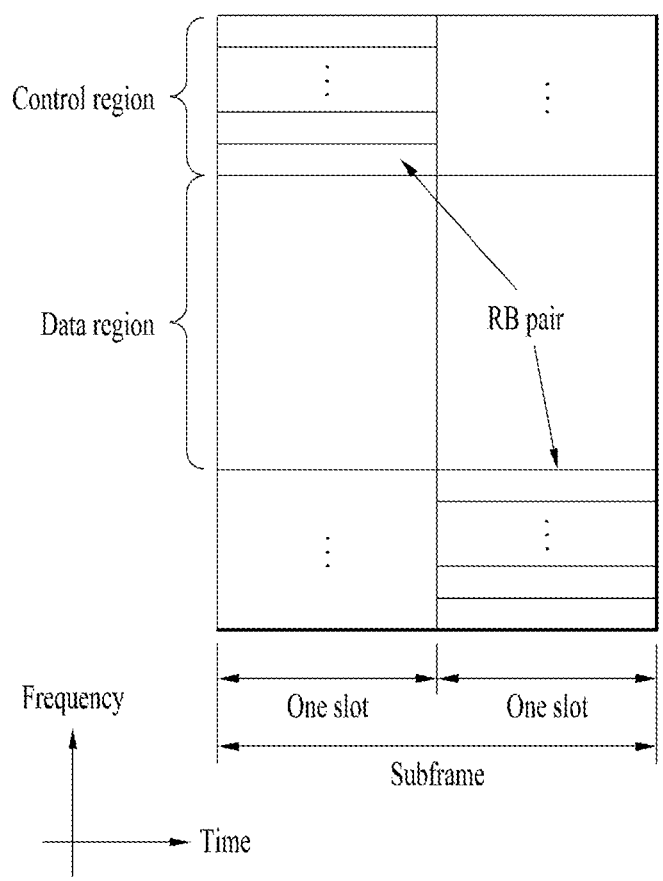
FIG. 4 is a diagram illustrating an exemplary structure of an uplink subframe.

FIG. 4 illustrates a structure of a UL subframe which may be used in embodiments of the present disclosure.

Referring to FIG. 4, a UL subframe may be divided into a control region and a data region in the frequency domain. A PUCCH carrying UCI is allocated to the control region and a PUSCH carrying user data is allocated to the data region. To maintain a single carrier property, a UE does not transmit a PUCCH and a PUSCH simultaneously. A pair of RBs in a subframe are allocated to a PUCCH for a UE. The RBs of the RB pair occupy different subcarriers in two slots. Thus it is said that the RB pair frequency-hops over a slot boundary.

Figure 5:
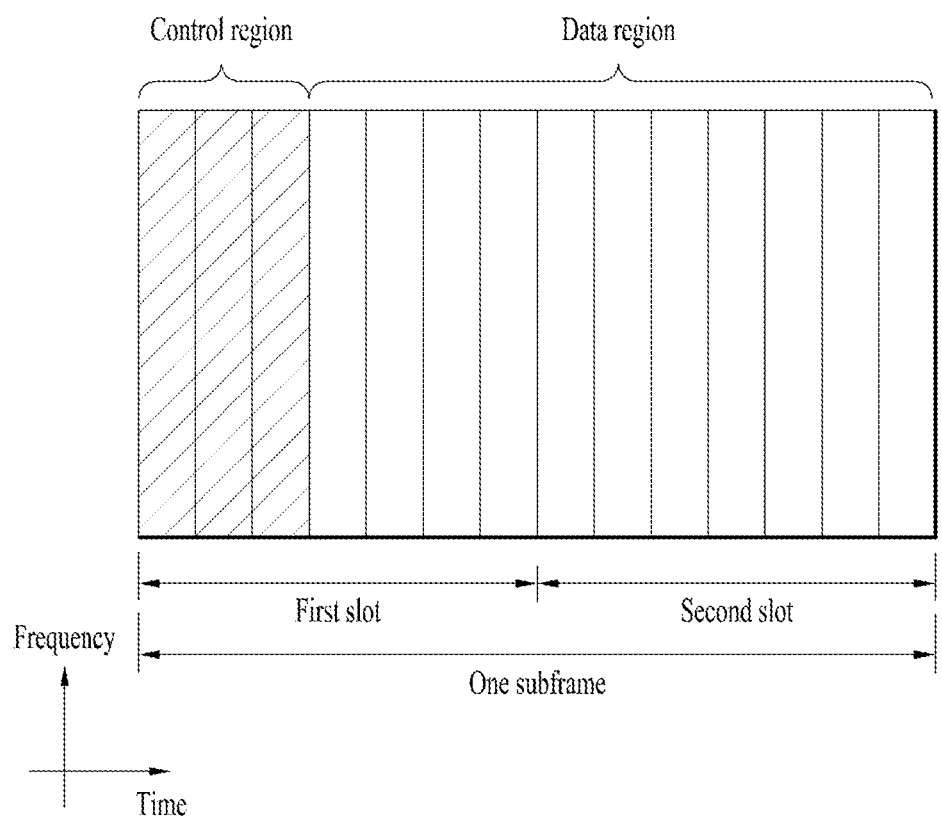
FIG. 5 is a diagram illustrating an exemplary structure of a downlink subframe.

FIG. 5 illustrates a structure of a DL subframe that may be used in embodiments of the present disclosure.

Referring to FIG. 5, up to three OFDM symbols of a DL subframe, starting from OFDM symbol 0 are used as a control region to which control channels are allocated and the other OFDM symbols of the DL subframe are used as a data region to which a PDSCH is allocated. DL control channels defined for the 3GPP LTE system include a Physical Control Format Indicator Channel (PCFICH), a PDCCH, and a Physical Hybrid ARQ Indicator Channel (PHICH).

a base station (BS or eNB). Herein, the CSI refers to information indicating the quality of a radio channel (or link) formed between the UE and an antenna port.

For example, the CSI may include a rank indicator (RI), a precoding matrix indicator (PMI), and a channel quality indicator (CQI).

Here, RI denotes rank information about the corresponding channel, which means the number of streams that the UE receives through the same time-frequency resource. This value is determined depending on the channel's Long Term Fading. Subsequently, the RI may be fed back to the BS by the UE, usually at a longer periodic interval than the PMI or CQI.

The PMI is a value reflecting the characteristics of a channel space and indicates a precoding index preferred by the UE based on a metric such as SINR.

The CQI is a value indicating the strength of a channel, and generally refers to a reception SINR that can be obtained when the BS uses the PMI.

In the 3GPP LTE or LTE-A system, the base station may set a plurality of CSI processes for the UE, and receive a report of the CSI for each process from the UE. Here, the CSI process is configured with a CSI-RS for specifying signal quality from the base station and a CSI-interference measurement (CSI-IM) resource for interference measurement.

1.4. RRM Measurement

LTE systems support radio resource management (RRM) operations including power control, scheduling, cell search, cell reselection, handover, radio link or connection monitoring, and connection establishment/re-establishment. In this operation, a serving cell may make a request to a UE for RRM measurement information, which is a measurement value for performing the RRM operation. As typical information, in an LTE system, a UE may measure information such as cell search information on each cell, reference signal received power (RSRP), and reference signal received quality (RSRQ) and report the same as typical information. Specifically, in the LTE system, the UE may receive 'measConfig' from the serving cell over a higher-layer signal for RRM measurement, and measure the RSRP or RSRQ according to the information of measConfig'

Here, RSRP, RSRQ, and RSSI disclosed in the LTE system may be defined as follows.

First, reference signal received power (RSRP) is defined as the linear average over the power contributions (in [W]) of the resource elements that carry cell-specific reference signals within the considered measurement frequency bandwidth. For example, for RSRP determination the cell-specific reference signals $R_0$ shall be used. If the UE can reliably detect that $R_1$ is available it may use $R_1$ in addition to $R_0$ to determine RSRP.

The reference point for the RSRP shall be the antenna connector of the UE.

If receiver diversity is in use by the UE, the reported value shall not be lower than the corresponding RSRP of any of the individual diversity branches.

Reference Signal Received Quality (RSRQ) is defined as the ratio N×RSRP/(E-UTRA carrier RSSI), where N is the number of RB's of the E-UTRA carrier RSSI measurement bandwidth. The measurements in the numerator and denominator shall be made over the same set of resource blocks.

E-UTRA Carrier Received Signal Strength Indicator (RSSI), comprises the linear average of the total received power (in [W]) observed only in OFDM symbols containing reference symbols for antenna port 0, in the measurement bandwidth, over N number of resource blocks by the UE from all sources, including co-channel serving and non-serving cells, adjacent channel interference, thermal noise etc. If higher-layer signalling indicates certain subframes for performing RSRQ measurements, then RSSI is measured over all OFDM symbols in the indicated subframes.

The reference point for the RSRQ shall be the antenna connector of the UE.

If receiver diversity is in use by the UE, the reported value shall not be lower than the corresponding RSRQ of any of the individual diversity branches.

Next, Received Signal Strength Indicator (RSSI) is defined as the received wide band power, including thermal noise and noise generated in the receiver, within the bandwidth defined by the receiver pulse shaping filter.

The reference point for the measurement shall be the antenna connector of the UE.

If receiver diversity is in use by the UE, the reported value shall not be lower than the corresponding UTRA carrier RSSI of any of the individual receive antenna branches.

In accordance with the definitions above, in the case of intra-frequency measurement, a UE operating in the LTE system may measure RSRP in the bandwidth indicated through the allowed measurement bandwidth-related information element (IE), which is transmitted on system information block type 3, in SIB3. Alternatively, in the case of inter-frequency measurement, the UE may measure RSRP in a bandwidth corresponding to one of 6, 15, 25, 50, 75, and 100 resource blocks (RBs) indicated through the allowed measurement bandwidth transmitted in SIBS. Alternatively, in the case where the IE is absent, the UE may measure RSRP in the frequency band of the entire downlink (DL) system as a default operation.

In this case, if the UE receives the information on the allowed measurement bandwidth, the UE may consider the corresponding value as the maximum measurement bandwidth and freely measure the RSRP value within the range of the corresponding value. However, if the serving cell transmits an IE defined as WB-RSRQ to the UE and the allowed measurement bandwidth is set to 50 RBs or more, the UE shall calculate the RSRP value for the entire allowed measurement bandwidth. In the RSSI measurement, the UE measures RSSI using the frequency band of the receiver of the UE according to the definition of the RSSI bandwidth.

1.5. PUCCH Format

Hereinafter, formats of the Physical Uplink Control Channel (PUCCH) applied to the LTE system will be described in detail.

Figure 6:
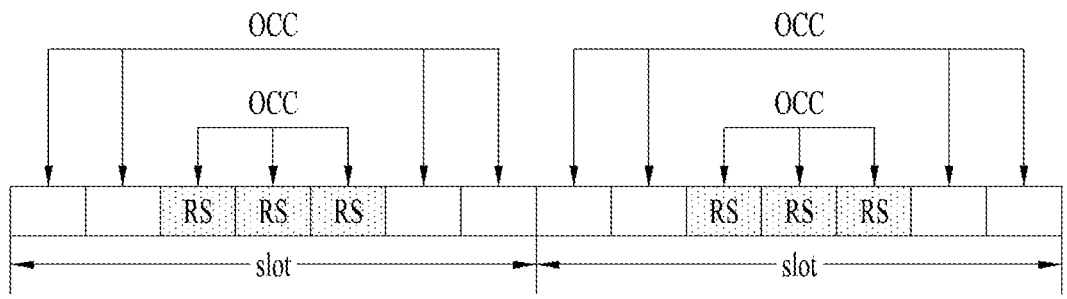
FIG. 6 is a diagram illustrating a configuration in which PUCCH of PUCCH formats 1/1a/1b, which are applied to the LTE system, is transmitted.

FIG. 6 is a diagram illustrating a configuration in which PUCCH of PUCCH formats 1/1a/1b, which are applied to the LTE system, is transmitted.

As shown in FIG. 6, in the case of PUCCH formats 1/1a/1b, a modulation reference signal (DM-RS) is transmitted over three symbols in one slot and HARQ-ACK is transmitted over the remaining four symbols. On the symbols over which the HARQ-ACK is transmitted, a length 12 Constant Amplitude Zero Auto-Correlation (CAZAC) sequence in the frequency dimension is multiplied by a modulated HARQ-ACK symbol, and is transmitted after Inverse Fast Fourier Transform (IFFT). When HARQ-ACK has a size of 1 bit, Binary Phase Shift Keying (BPSK) modulation is performed. When the HARQ-ACK has a size of 2 bits, (2-codeword) Quadrature Phase Shift Keying (QPSK) modulation is performed. In addition, in order to allow more UEs to be subjected to CDM in the same resource, the HARQ-ACK symbol may be identically configured over 4 symbols and be transmitted by being multiplied by a length 4 orthogonal cover code (OCC) in the time dimension. When 12 cyclic shifts of the 12-CAZAC sequence at the maximum are used and the length 3 OCC of the DM-RS is considered, a maximum of 36 UEs may simultaneously attempt HARQ-ACK transmission in one PUCCH format 1.

In the LTE system, the resource indexes of PUCCH format 1 are set as a function of the lowest CCE index of the PDCCH. That is, in transmitting, in SF #n+k, HARQ-ACK corresponding to the PDSCH transmitted from the eNB in SF #n, the UE may transmit the HARQ-ACK through a PUCCH index in SF #n+k having an implicit linkage configured for the lowest CCE index of the PDCCH in SF #n.

Figure 7:
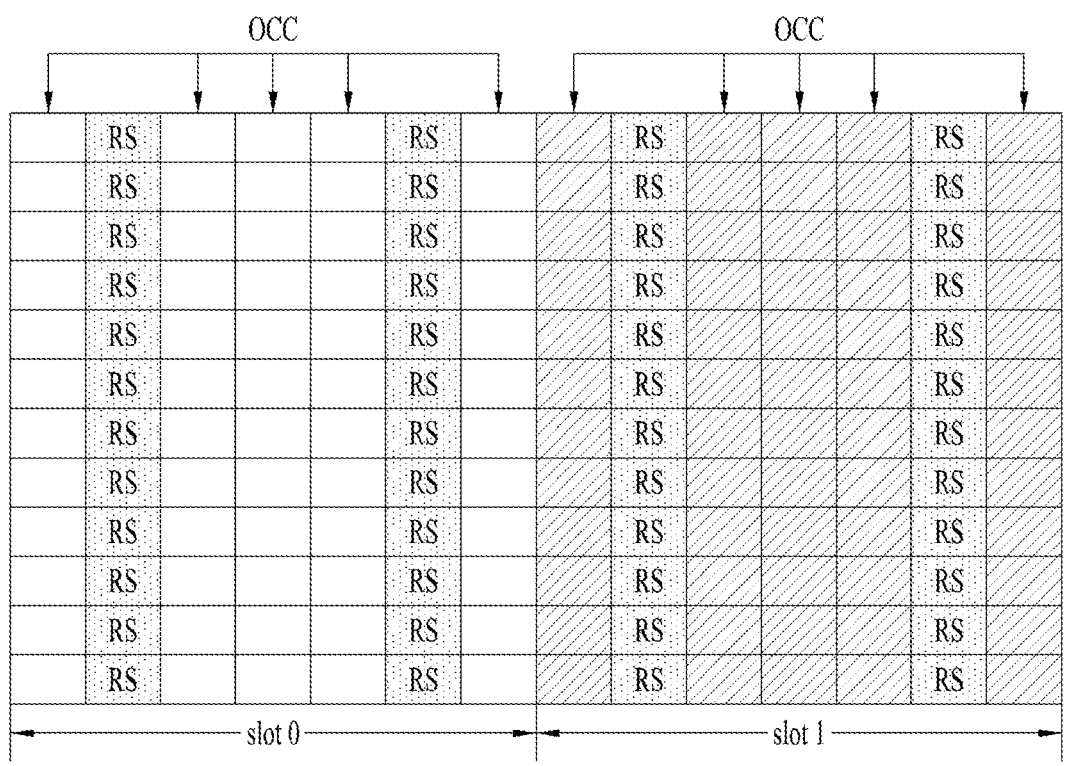
FIG. 7 is a diagram illustrating a configuration in which PUCCH of PUCCH format 3, which is applied to the LTE system, is transmitted.

FIG. 7 is a diagram illustrating a configuration in which PUCCH of PUCCH format 3, which is applied to the LTE system, is transmitted.

As shown in FIG. 7, in the case of PUCCH format 3, a data symbol spread by Discrete Fourier Transform (DFT) to 12 subcarriers may be repeatedly transmitted over 5 symbols in each slot, and be multiplied by a length 5 OCC in the time dimension such that up to five UEs may be subjected to CDM. At this time, since one QPSK symbol is transmitted in each RE, 48 coded bits may be transmitted within 1 RB pair.

Figure 8:
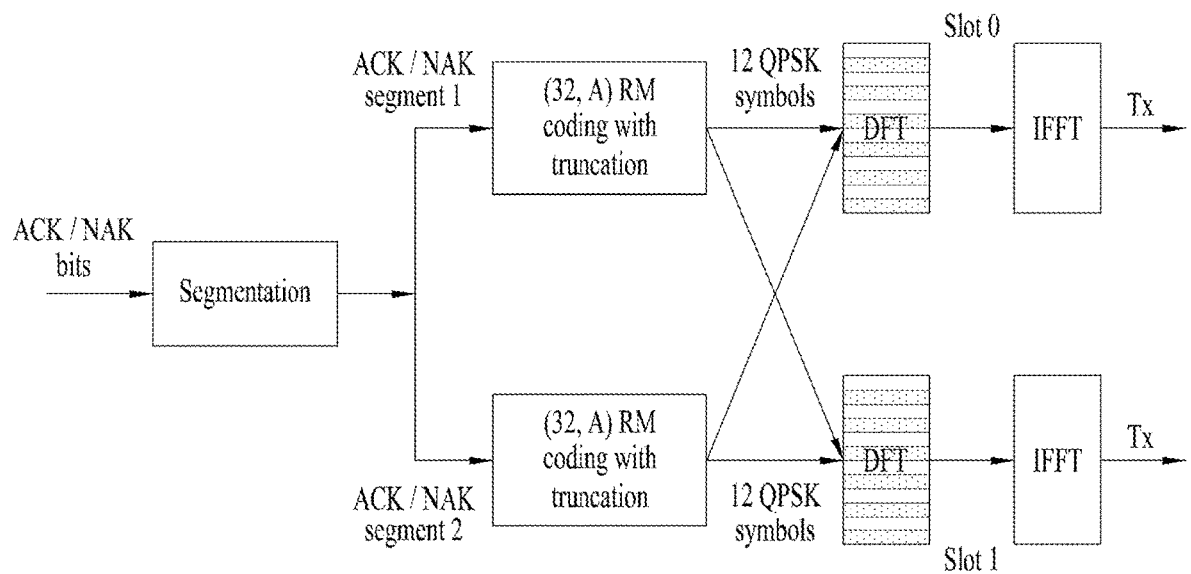
FIG. 8 is a diagram illustrating a specific operation of transmitting PUCCH of PUCCH format 3, which is applied to the LTE system.

FIG. 8 is a diagram illustrating a specific operation of transmitting PUCCH of PUCCH format 3, which is applied to the LTE system.

In encoding the 48 coded bits, different channel coding schemes are defined according to the number of transmission bits. Specifically, if input bit-stream A is less than or equal to 11 bits, the UE performs (32, A) single RM coding, and then generates 48 bits through circular repetition.

At this time, if the input bit stream is more than 11 bits and less than 21 bits, the UE may divide the input bit stream into two segments using a dual RM code, as shown in FIG. 8.

Subsequently, the UE applies the (32, A) RM code to each segment and then generates 24-bit information through truncation. Subsequently, the UE performs symbol interleaving on the 24-bit output for each segment, and then transmits the corresponding information in each slot.

Figure 9:
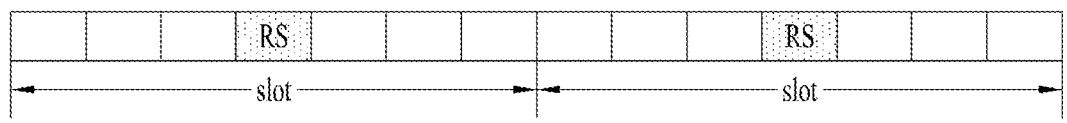
FIG. 9 is a diagram illustrating a configuration in which PUCCH of PUCCH format 4, which is applied to the LTE system, is transmitted.

FIG. 9 is a diagram illustrating a configuration in which PUCCH of PUCCH format 4, which is applied to the LTE system, is transmitted.

If more than 5 CCs are aggregated, HARQ-ACK information of 21 bits or more may be generated. In this case, it may not be proper to transmit the information only through the conventional PUCCH format 3. Accordingly, in the Release-13 system, PUCCH format 4 and PUCCH format 5 capable of transmitting more HARQ-ACK information are proposed. Of the formats, PUCCH format 4 basically conforms to the PUSCH structure and does not allow CDM between UEs.

Specifically, as shown in FIG. 9, the position of the DM-RS is the same as on the PUSCH. The UE may concatenate HARQ-ACK of 22 bits or more with a cyclic redundancy check (CRC) and encode the same through TBCC, and then transmit QPSK-modulated symbols in a time-first mapping manner. In addition, in the case of PUCCH format 4, multiple RB pairs may be supported and the RB pair unit in which the HARQ-ACK information is transmitted among 1/2/3/4/5/6/8 RB pairs may be RRC-configured.

Figure 10:
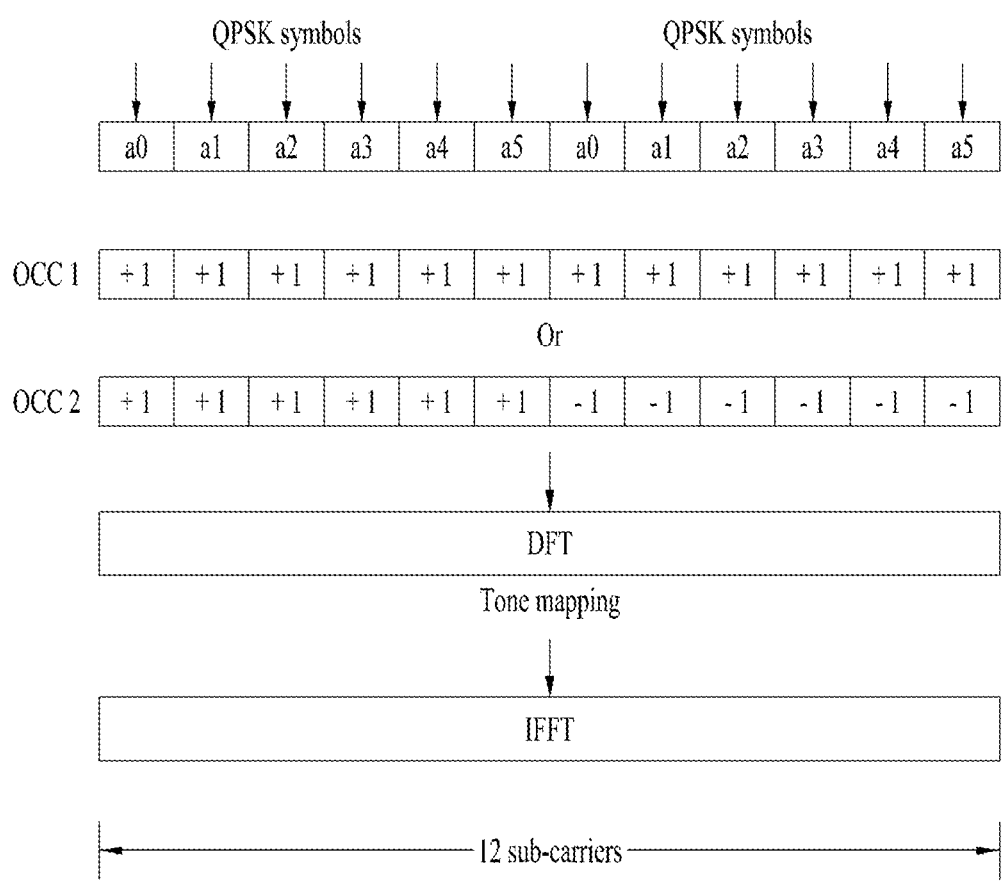
FIG. 10 is a diagram illustrating a configuration in which PUCCH of PUCCH format 5, which is applied to the LTE system, is transmitted.

FIG. 10 is a diagram illustrating a configuration in which PUCCH of PUCCH format 5, which is applied to the LTE system, is transmitted.

Unlike PUCCH format 4, PUCCH format 5 may be configured only on a 1-RB basis. As shown in FIG. 10, 1 PRB may be divided into two segments each having 6 subcarrier units in the frequency dimension, and a length 2 OCC may be applied to each segment. Then, HARQ-ACK information may be included in 72 REs. Thus, up to two UEs may be subjected to CDM.

In addition, in the LTE system, a PUCCH resource in which PUCCH format 5 is transmitted is configured through a combination of RRC signaling and a DL grant.

2. New Radio Access Technology System

As more and more communication devices require greater communication capacity, there is a need for mobile broadband communication enhanced over existing radio access technology (RAT). In addition, massive Machine-Type Communications (MTC) capable of providing a variety of services anywhere and anytime by connecting multiple devices and objects is also considered. Communication system design considering services/UEs sensitive to reliability and latency is also under discussion.

As such, introduction of new radio access technology considering enhanced mobile broadband communication, massive MTC, and Ultra-Reliable and Low Latency Communication (URLLC) is being discussed. In the present invention, for simplicity, this technology will be referred to as New RAT or NR (New Radio).

2.1. Self-Contained Subframe Structure

Figure 11:
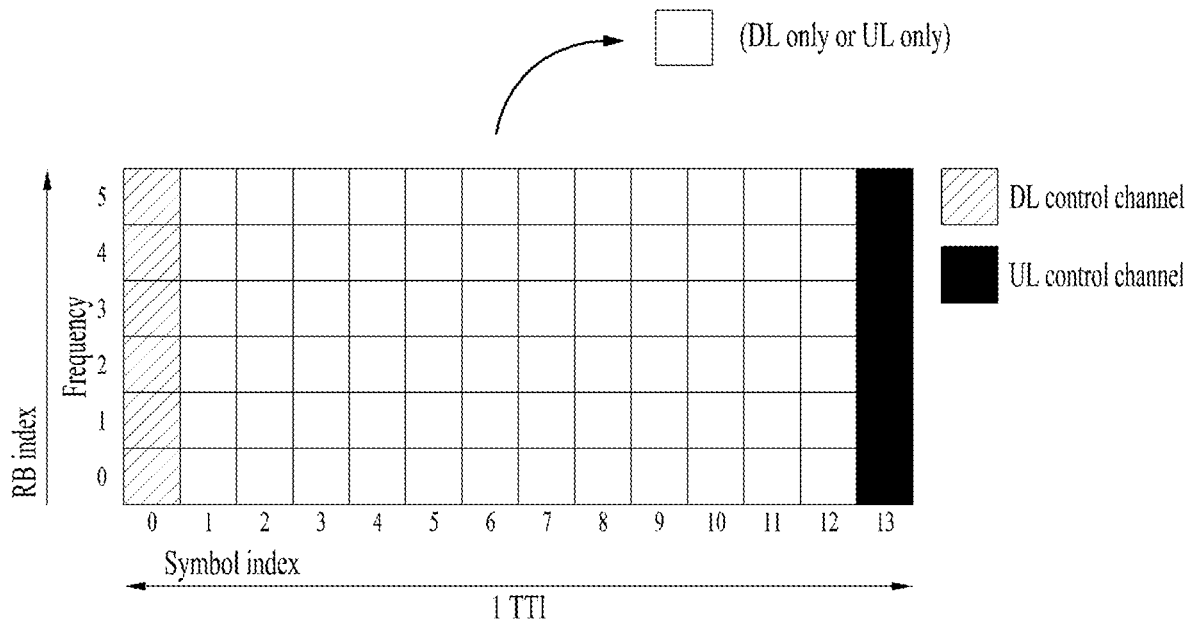
FIG. 11 is a diagram illustrating a self-contained subframe structure applicable to the present invention.

FIG. 11 is a diagram illustrating a self-contained subframe structure applicable to the present invention.

In the NR system to which the present invention is applicable, a self-contained subframe structure as shown in FIG. 11 is proposed in order to minimize data transmission latency in the TDD system.

In FIG. 11, the hatched region (e.g., symbol index=0) represents a downlink control region, and the black region (e.g., symbol index=13) represents an uplink control region. The other region (e.g., symbol index=1 to 12) may be used for downlink data transmission or for uplink data transmission.

In this structure, DL transmission and UL transmission may be sequentially performed in one subframe. In addition, DL data may be transmitted and received in one subframe and UL ACK/NACK therefor may be transmitted and received in the same subframe. As a result, this structure may reduce time taken to retransmit data when a data transmission error occurs, thereby minimizing the latency of final data transmission.

In such a self-contained subframe structure, a time gap having a certain temporal length is required in order for the base station and the UE to switch from the transmission mode to the reception mode or from the reception mode to the transmission mode. To this end, some OFDM symbols at the time of switching from DL to UL in the self-contained subframe structure may be set as a guard period (GP).

While a case where the self-contained subframe structure includes both the DL control region and the UL control region has been described above, the control regions may be selectively included in the self-contained subframe structure. In other words, the self-contained subframe structure according to the present invention may include not only the case of including both the DL control region and the UL control region but also the case of including either the DL control region or the UL control region alone, as shown in FIG. 11.

For simplicity of explanation, the frame structure configured as above is referred to as a subframe, but this configuration can also be referred to as a frame or a slot. For example, in the NR system, one unit consisting of a plurality of symbols may be referred to as a slot. In the following description, a subframe or a frame may be replaced with the slot described above.

2.2. OFDM Numerology

The NR system uses the OFDM transmission scheme or a similar transmission scheme. Here, the NR system may typically have the OFDM numerology as shown in Table 2.

TABLE 2

| Parameter | Value |
| --- | --- |
| Subcarrier-spacing (Δf) | 75 kHz |
| OFDM symbol length | 13.33 μs |
| Cyclic Prefix (CP) length | 1.04 μs/0.94 μs |
| System BW | 100 MHz |
| No. of available subcarriers | 1200 |
| Subframe length | 0.2 ms |
| Number of OFDM symbol per Subframe | 14 symbols |

Alternatively, the NR system may use the OFDM transmission scheme or a similar transmission scheme, and may use an OFDM numerology selected from among multiple OFDM numerologies as shown in Table 3. Specifically, as disclosed in Table 3, the NR system may take the 15 kHz subcarrier-spacing used in the LTE system as a base, and use an OFDM numerology having subcarrier-spacing of 30, 60, and 120 kHz, which are multiples of the 15 kHz subcarrier-spacing.

In this case, the cyclic prefix, the system bandwidth (BW) and the number of available subcarriers disclosed in Table 3 are merely an example that is applicable to the NR system according to the present invention, and the values thereof may depend on the implementation method. Typically, for the 60 kHz subcarrier-spacing, the system bandwidth may be set to 100 MHz. In this case, the number of available subcarriers may be greater than 1500 and less than 1666. Also, the subframe length and the number of OFDM symbols per subframe disclosed in Table 3 are merely an example that is applicable to the NR system according to the present invention, and the values thereof may depend on the implementation method.

TABLE 3

| Parameter | Value | Value | Value | Value |
|---|---|---|---|---|
| Subcarrier-spacing (Δf) | 15 kHz | 30 kHz | 60 kHz | 120 kHz |
| OFDM symbol length | 66.66 | 33.33 | 16.66 | 8.33 |
| Cyclic Prefix(CP) length | 5.20 μs/4.69 μs | 2.60 μs/2.34μs | 1.30 μs/1.17 μs | 0.65 μs/0.59 μs |
| System BW | 20 MHz | 40 MHz | 80 MHz | 160 MHz |
| No. of available subcarriers | 1200 | 1200 | 1200 | 1200 |
| Subframe length | 1 ms | 0.5 ms | 0.25 ms | 0.125 ms |
| Number of OFDM symbol per Subframe | 14 symbols | 14 symbols | 14 symbols | 14 symbols |

2.3. Analog Beamforming

In a millimeter wave (mmW) system, since a wavelength is short, a plurality of antenna elements can be installed in the same area. That is, considering that the wavelength at 30 GHz band is 1 cm, a total of 100 antenna elements can be installed in a 5*5 cm panel at intervals of 0.5 lambda (wavelength) in the case of a 2-dimensional array. Therefore, in the mmW system, it is possible to improve the coverage or throughput by increasing the beamforming (BF) gain using multiple antenna elements.

In this case, each antenna element can include a transceiver unit (TXRU) to enable adjustment of transmit power and phase per antenna element. By doing so, each antenna element can perform independent beamforming per frequency resource.

However, installing TXRUs in all of the about 100 antenna elements is less feasible in terms of cost. Therefore, a method of mapping a plurality of antenna elements to one TXRU and adjusting the direction of a beam using an analog phase shifter has been considered. However, this method is disadvantageous in that frequency selective beamforming is impossible because only one beam direction is generated over the full band.

To solve this problem, as an intermediate form of digital BF and analog BF, hybrid BF with B TXRUs that are fewer than Q antenna elements can be considered. In the case of the hybrid BF, the number of beam directions that can be transmitted at the same time is limited to B or less, which depends on how B TXRUs and Q antenna elements are connected.

Figure 12:
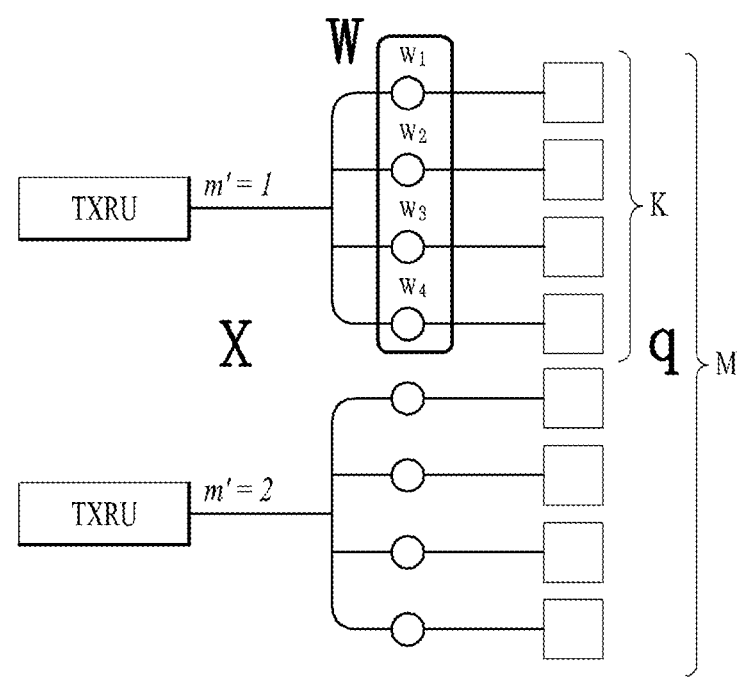
FIGS. 12 and 13 are diagrams illustrating representative methods for connecting TXRUs to antenna elements.
Figure 13:
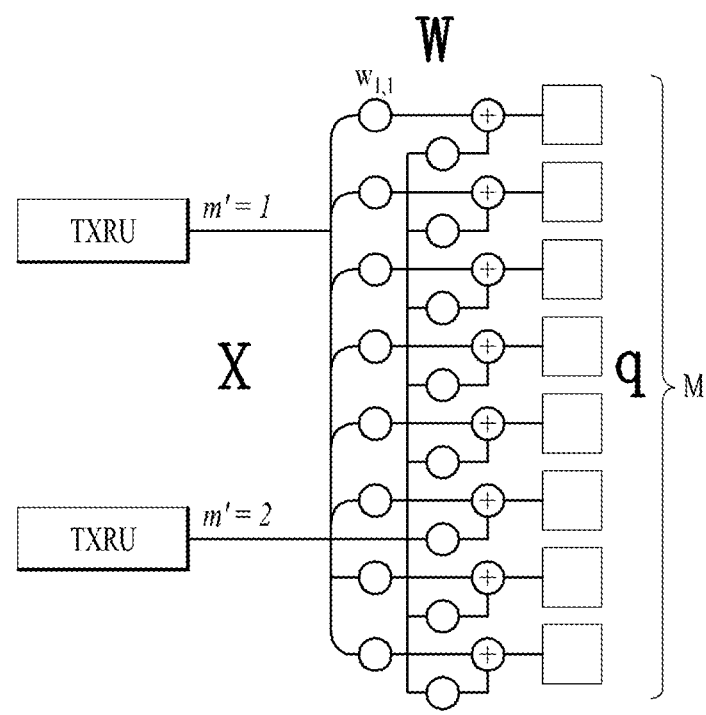

FIGS. 12 and 13 are diagrams illustrating representative methods for connecting TXRUs to antenna elements. Here, the TXRU virtualization model represents the relationship between TXRU output signals and antenna element output signals.

FIG. 12 shows a method for connecting TXRUs to sub-arrays. In FIG. 12, one antenna element is connected to one TXRU.

Meanwhile, FIG. 13 shows a method for connecting all TXRUs to all antenna elements. In FIG. 13, all antenna element are connected to all TXRUs. In this case, separate addition units are required to connect all antenna elements to all TXRUs as shown in FIG. 13.

In FIGS. 12 and 13, W indicates a phase vector weighted by an analog phase shifter. That is, W is a major parameter determining the direction of the analog beamforming. In this case, the mapping relationship between CSI-RS antenna ports and TXRUs may be 1:1 or 1-to-many.

The configuration shown in FIG. 12 has a disadvantage in that it is difficult to achieve beamforming focusing but has an advantage in that all antennas can be configured at low cost.

On the contrary, the configuration shown in FIG. 13 is advantageous in that beamforming focusing can be easily achieved. However, since all antenna elements are connected to the TXRU, it has a disadvantage of high cost.

3. Proposed Embodiments

In the NR system, which is being discussed as one of the 5G next-generation communication technologies, not only a frequency band of 6 GHz or more but also a sub-6 GHz frequency band is considered as an operable frequency band. Particularly, the NR system is considering an operation utilizing, in the sub-6 GHz frequency, a frequency band (for example, 3.5 GHz) in which the legacy LTE system operates as well as a new frequency band in which the legacy LTE system does not operate. Here, the deployment scenario in which the NR system and the legacy LTE system coexist in the frequency band in which the legacy LTE system operates may be interpreted as reflecting the demands of the network operators who want to release the NR system in the current communications market as quickly as possible.

For example, there may be a scenario in which the corresponding LTE system is replaced with the NR system by software upgrade alone for some (or the entirety) of the LTE system-based small cell base stations installed in a hotspot area. In this case, each of the small cells may be connected to a macro cell through an ideal backhaul and operate under a carrier aggregation framework, or the small cells may be connected to the macro cell through a non-ideal backhaul and operate in dual connectivity. In this case, a point to be additionally considered is that UEs capable of operating in the NR system and UEs supporting only the legacy LTE system may coexist in the same band in the transition period of the communication system (for example, transition (or transfer) from 4G to 5G).

Considering UEs supporting only the LTE system, some eNBs may drive (or apply) only the LTE system without being upgraded to the NR system. In this case, a scenario in which an LTE-based eNB and an NR-based base station (new generation NodeB, hereinafter gNB) coexist while not being located at the same place (i.e., the non-co-located scenario) may be considered. Alternatively, a scenario may be considered in which all base stations are upgraded to gNBs, while some gNBs use a part or the entirety of a corresponding band at some points in time to temporarily provide the LTE-based service for UEs supporting only LTE.

Accordingly, the present invention proposes a method for an eNB and a gNB to effectively coexist in the non-co-located scenario where the eNB and the gNB are not located at the same place or in the co-located scenario where the eNB and the gNB are located at the same place.

Specifically, the present invention proposes a neighbor cell measurement method considering the implementation complexity of a UE in the non-co-located scenario, and proposes a method for supporting Ultra Reliable Low Latency Communications (URLLC), which is an important use case of the NR system in the co-Located scenario.

However, the technical configurations described below may have extended applications regardless of the non-co-located/co-located scenarios described above, and is also applicable to a frequency sharing technique through carrier aggregation/dual connectivity between NR systems.

3.1. RRM Measurement

In the legacy LTE-A system, a discovery signal (DRS) was introduced for measurement for a small cell deactivated due to lack of traffic. The DRS may be configured to be periodically transmitted once every several tens of milliseconds.

For example, an eNB may periodically configure a discovery measurement timing configuration (DMTC) of a unit of 6 ms for the UE. In response, the UE may receive the DRS within the corresponding DMTC interval, and use the same for coarse synchronization, cell detection, and RRM measurement. Here, the RRM measurement may include measurement of reference signal received power (RSRP), which is the strength of a signal from a desired cell, and measurement of a reference signal received quality (RSRQ), which is a ratio of the strength of a signal from the desired cell to interference and noise.

Here, signals constituting the DRS may include a primary synchronization signal (PSS), a secondary synchronization signal (SSS), and a cell-specific reference signal (CRS). The signals constituting the DRS may include a channel state information-RS (CSI-RS) whether or not there is an additional configuration.

Even in the NR system to which the present invention is applicable, serving cell measurement and intra-frequency or inter-frequency neighbor cell measurement may be essentially supported for the purpose of preparation for handover due to mobility of the UE. To this end, similar to the DRS in the LTE system, a signal usable for purposes such as cell search and RRM measurement may be defined in the NR system. In the following description, this signal is referred to as an NR-DRS so as to be distinguished from the DRS of the LTE system.

The NR-DRS may include a part or the entirety of the PSS, the SSS, the beamforming RS (BRS), the beam refinement RS (BRRS), and the CSI-RS. In addition, the gNB may configure a time window for performing measurement on the NR-DRS. Here, In the following description, the time window is referred to as an NR-DMTS so as to be distinguished from the DMTS of the LTE system. The NR-DMTC may be configured with a periodicity of several tens of milliseconds (or several hundred milliseconds), thereby reducing the measurement burden on the UE.

3.1.1. Configuration Relationship Between LTE-DMTC and NR-DMTC

FIG. 14 is a diagram schematically illustrating an example of configuration of an LTE-DMTC and an NR-DMTC in a scenario where an eNB and a gNB are non-co-located according to the present invention.

As shown in FIG. 14, in a deployment scenario in which the eNB and the gNB are non-co-located, if a UE capable of operating in the NR system as well as the LTE system is located at the coverage boundary of the eNB and the gNB, the UE should perform measurement not only on the LTE but also on the NR.

At this time, two schemes may be considered. For example, causing LTE-DMTC and NR-DMTC to overlap each other may be considered as denoted by scheme (a) in FIG. 14, or the LTE-DMTC and NR-DMTC may be configured independently as denoted by scheme (b) in FIG. 14. Hereinafter, each scheme will be described in detail.

3.1.1.1. First Scheme (Causing LTE-DMTC and NR-DMTC to Overlap)

According to the first scheme, a UE associated with the eNB may assume that the NR-DRS is also transmitted within a configured LTE-DMTC. On the other hand, a UE associated with the gNB may assume that the LTE-DRS is also transmitted within a configured NR-DMTC. According to this scheme, implementation of a UE may be simplified in terms of implementation of a UE performing DRS detection. This is because the UE performing DRS detection is capable of simultaneously acquiring time simples for DRSs of different systems and extracting the DRSs for each system through buffering.

At this time, the center frequencies of the NR-DRS and the LTE-DRS may be set to equal each other, or some signals may be configured to overlap in the frequency dimension. Alternatively, the NR-DRS and the LTE-DRS may be configured to be subjected to Frequency Division Multiplexing (FDM) in order to minimize interference between different systems.

For example, the PSS/SSS of the LTE-DRS may be transmitted at the center frequency of a carrier used in the LTE system, and the NR-DRS may be transmitted, ensuring that it has no frequency resource overlapping the frequency resources of the PSS/SSS of the LTE-DRS.

In addition, a UE which is operable in both the LTE and NR systems may receive, from the serving cell, signaling indicating which of the NR-DRS and the LTE-DRS is to be received to perform cell identification. In addition, when the NR-DRS and the LTE-DRS are subjected to FDM, the UE may receive, from the serving cell, signaling about a frequency resource in which each DRS is transmitted.

3.1.1.2. Second Scheme (Independently Configuring LTE-DMTC and NR-DMTC)

A UE associated with the eNB may further receive a configured NR-DMTS in addition to the configured LTE-DMTS and assume that the NR-DRS is transmitted in the NR-DMTC. On the other hand, a UE associated with the gNB may further receive a configured LTE-DMTC in addition to the configured NR-DMTC and assume that LTE-DRS is transmitted in the LTE-DMTC.

Which of the first method and the second method described above is applied may be set to be configurable according to the network (i.e., network configurable). In this regard, as an example, when the serving cell is an eNB, a specific UE may assume the second scheme if the NR-DMTC is additionally configured, and may assume the first scheme if the NR-DMTC is not additionally configured.

Additionally, the NR gNB may also transmit an LTE-DRS. Through this operation, the NR gNB may advertise that there is an NR cell in the vicinity thereof. A UE receiving the LTE-DRS may perform measurement on the LTE-DRS and report the measurement result to an eNB. The eNB receiving the result may recognize presence of a neighbor cell gNB and perform inter-cell coordination.

The operation described above may be particularly useful in an unlicensed spectrum. Due to the nature of the unlicensed spectrum, different operators may be deployed. One of the operators may operate an LTE system and the other operator may operate an NR system. At this time, if information about a neighbor operator is recognized through the LTE-DRS and inter-cell coordination (e.g., TDM and/or FDM) is performed, inter-cell interference may be reduced.

3.1.2. New RSRQ Measurement Method in LTE System

According to the legacy LTE system, the UE may perform RSRQ measurement in a configured DMTC interval. However, the interference situation may be greatly affected by the presence or absence of traffic of neighbor cells in reality. Considering this point, it may not be preferred for the UE to measure the amount of interference in the DMTC that is always configured to transmit a signal.

In the Release-13 licensed assisted access (LAA) system, received signal strength indicator (RSSI) measurement is separately defined for use in carrier selection of the unlicensed spectrum, and UEs are configured to report an average RSSI value and a channel occupancy (a proportion of samples whose RSSI value is greater than a threshold value). In addition, an RSSI measurement timing configuration (RMTC) has been newly introduced for RSSI measurement. In this context, the RMTC may be configured independently of the DMTC.

However, in the recent LTE system, RSSI measurement for RSRQ measurement is still configured to be performed within the DMTC interval. In this section, a method for performing RSSI measurement for RSRQ measurement in a newly configured RMTC interval instead of the DMTC interval is proposed.

Thus, the RMTC may be introduced not only in an LAA SCell, but also in licensed carriers. In this case, from the perspective of RRM measurement reporting, the UE may report only the RSSI value measured in the corresponding RMTC and the RSRP value (without reporting the RSRQ). Alternatively, the UE may report an RSRP value and an RSRQ value, which is defined as a function of the ratio of the RSRP value to the RSSI value measured in the RMTC.

In addition, as a method for increasing the degree of freedom of utilization of the RSSI measurement value from the perspective of a network which knows the transmission times of the eNB and the gNB, the UE may be configured to calculate an average of the RSSI values only within the RMTC interval and report RSSI values (or RSRQ values) equal in number to the RMTC intervals belonging to an RSSI reporting period.

For example, if the RMTC is configured for a specific UE at intervals of 40 ms and the RSSI average value is set to be reported every 240 ms, the specific UE may separately report six RSSI values whose average is calculated for each RMTC interval. Alternatively, a plurality of RMTCs may be configured for the same frequency band for the specific UE, and the UE may be configured to report a separate RSSI value (or RSRQ value) for each RMTC.

3.1.3. LTE-DRS Protection Method in NR system

The NR system additionally disposed in the band where the legacy LTE system operates may reduce interference in LTE-DRS reception of the UE in consideration of degradation of the RRM measurement performance of the legacy system. In other words, the NR system may protect the LTE-DRS from other signals in the NR system. To this end, the gNB of the NR system may leave resource elements (REs) overlapping with the LTE-DRS blank and transmit a corresponding signal.

FIG. 15 is a diagram illustrating a signal transmitted from an NR system according to an embodiment of the present invention.

As shown in FIG. 15, when a 30 kHz subcarrier spacing is applied to an NR system applicable to the present invention, the temporal length of two REs may correspond to the length of one symbol of the LTE system.

In this case, for example, in the NR system, signals may be transmitted by puncturing (or rate-matching) REs of a subframe of the NR system that overlap the REs corresponding to CRS antenna port 0 (or additionally AP 1) of a neighbor cell (e.g., LTE cell).

At this time, the set of the REs may be pre-configured by higher layer signaling in advance, and an indication of whether the set of the REs is punctured (or rate-matched) in the corresponding subframe may be delivered through Layer 1 (L1) signaling.

As another example, in the NR system, a CRS (corresponding to the cell/beam/TRP ID of the gNB) may be transmitted without puncturing the REs of a subframe of the NR system that overlap the REs corresponding to CRS antenna port 0 (or additionally AP 1) of a neighbor cell (e.g., LTE cell). This configuration is applicable to several LTE cells. Thus, in the NR system to which the present invention is applicable, the NR-DRS may be transmitted through puncturing of all OFDM symbols in which the CRS/PSS/SSS (additionally, the CSI-RS) are transmitted to or through other symbols.

At this time, whether to perform puncturing (or rate-matching) on the overlapping REs or to perform puncturing (or rate-matching) on all OFDM symbols may be configured through separate signaling.

The LTE-DRS protection method described above may be applied even when the subcarrier spacings of the LTE system and the NR system are the same and also be applied even to REs or OFDM symbols in which the PSS/SSS/CSI-RS of the LTE system as well as the CRS are transmitted.

Additionally, in the case where the gNB of the NR system performs puncturing or rate-matching on the NR data in consideration of REs overlapping the LTE-DRS (in particular, the CRS) and the corresponding UE receives the NR data as described above, the gNB and the UE may require information about the center frequency of the LTE carrier. This is because nulling the Direct Current (DC) tone is used in DL transmission in the LTE system, while the DC tone may be allowed to be handled in the same way as other subcarriers in DL transmission in the NR system at least in view of the transmitter. Therefore, even if one resource block (RB) is configured by a unit of 12 REs in both the LTE system and the NR system, the relationship between resource blocks of the NR system may not coincide with that of the LTE system at the boundary of DC tone of the LTE carrier.

In light of the above, signaling for indicating the position of a subcarrier in the NR carrier that corresponds to the DC tone of the LTE system may be introduced. Alternatively, the center frequency of the NR carrier may be set equal to the DC tone of the LTE system such that the UE may recognize the DC tone of the LTE system without additional signaling.

In general, when the total number of subcarriers used in the NR carrier is N, the DC tone position of the LTE system may be determined as a function of N. For example, the DC tone position of the LTE system may be set by a rule such as N/2, N/2−1, N/2+1, N−offset, N/2+offset, or N/2−offset. Here, the offset may be preset or may be set by higher layer signaling (or L1 signaling).

Alternatively, introduction of signaling for indicating whether the center frequencies of the LTE system and the NR system coincide or not may be considered. In this case, only when the center frequencies of the two systems do not coincide, may an offset for the degree of spacing (or degree of separation) of the subcarriers be delivered or may information about the center frequency of the LTE system be indicated (to the UE).

Alternatively, when the center frequencies of the LTE system and the NR system do not coincide with each other, it may be assumed that a scheme of applying muting at the OFDM symbol level is employed rather than a scheme of applying muting at the RE level for the CRS.

In other words, a UE that has received configuration (or indication) of rate matching of the CRS RE level may calculate a CRS position on the assumption that the center frequencies of the LTE system and the NR system coincide with each other and assume that rate matching by muting only REs overlapping the CRS is performed. Further, in this case, the UE may assume that the cell IDs coincide or that at least the V shift value can be calculated using a cell ID derived from the NR synchronization signal (i.e., NR_Pcid % 3=LTE_Pcid % 3).

Additionally, if the numerology applied to the NR system is not 15 kHz, performing muting at the RE level on the CRS as described above may mean that muting is applied over several REs or several symbols due to application of another numerology. As a method for reducing complexity in this case, muting at the RE level may be limited to a case where the LTE system and the NR system use the same numerology or subcarrier spacing. Accordingly, the UE or the like may assume that the same numerology or subcarrier spacing is used if the UE receives configuration of muting at the RE level. If the numerology or subcarrier spacing of the NR system is different from that of the LTE system, the UE or the like may assume that a scheme of leaving the symbol(s) blank is employed in place of the RE level.

In an embodiment to which the present invention is applicable, a numerology different from the numerology of the LTE system may be applied to the synchronous signal of the NR system. At this time, the synchronization signal of the NR system may be transmitted at a time/frequency position different from the CRS position of the LTE system.

When the CRS of the LTE system and the synchronization signal of the NR system overlap each other in the same time/frequency resource, only one of the signals may be allowed to be transmitted due to the nature of signals. In other words, the CRS of the LTE system and the synchronization signal of the NR system need to be designed so as not to collide with each other.

Therefore, the UE may assume that the CRS of the LTE system is transmitted in a subframe in which the synchronization signal of the NR system is received by puncturing the synchronization signal of the NR system or that the subframe in which the synchronization signal of the NR system is received is a Multimedia Broadcast Single Frequency Network (MBSFN) subframe without CRS transmission. Alternatively, the UE may assume that no CRS is transmitted in the subframe in which the synchronization signal of the NR system is received. More details will be described in section 3.2 later. In the case above, the information indicating the assumption above may be delivered through separate signaling.

Further, when data transmission is performed through a specific RB in the LTE system, the NR system may schedule data transmission, avoiding the RB in which data is transmitted in the LTE system.

Figure 16:
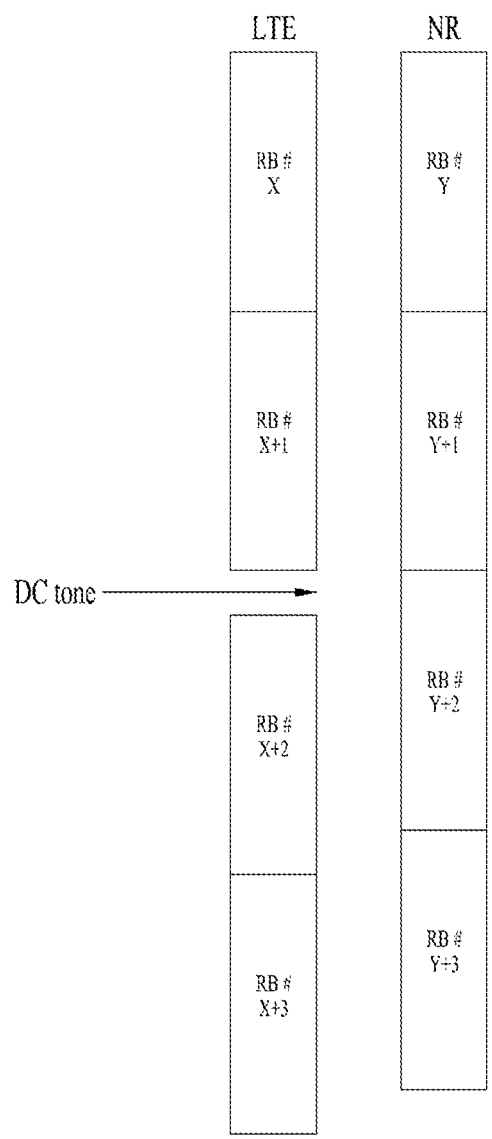
FIG. 16 is a diagram illustrating an example of scheduling data transmission of an NR system according to the present invention.

FIG. 16 is a diagram illustrating an example of scheduling data transmission of an NR system according to the present invention.

As shown in FIG. 16, the NR system may not schedule data transmission on RB #Y, considering LTE data to be transmitted in RB #X.

However, even in this case, DC tone handling differs between the LTE system and the NR system and therefore the RB boundaries of the systems may not be accurately aligned with each other. For example, the NR system may schedule data transmission on RB #Y+3-phase, considering LTE data that is to be transmitted in RB #X+2, but some REs of the RB on which data transmission is scheduled may overlap RB #X+2.

As a method for addressing this issue, when data transmission on RB #Y+3 is scheduled in the NR system, information on REs overlapping LTE transmission resources may be signaled to a UE or the like. In the case of FIG. 16, the gNB of the NR system may indicate to the UE (by L1 signaling or scheduling DCI) that puncturing or rate-matching has been applied to one RE on RB #Y+3.

In addition, if synchronization between the LTE cell and the NR cell is not correctly established, DL transmission of the NR system may be performed in consideration of the timing uncertainty. For example, when performing puncturing or rate-matching on NR data in consideration of REs overlapping LTE-DRS (especially CRS) in the NR system, NR DL transmission may be performed in consideration of frequency resources on two symbols which may overlap the corresponding signals.

In addition, if the NR system does not use a symbol in which the CRS of the LTE system is transmitted but uses only other symbols in signal transmission, and LTE data transmission is performed based on the CQI reported by the LTE UE, which performs CSI measurement based on the CRS, the probability of failure of LTE data transmission may increase due to the NR signal transmitted outside the symbol in which the CRS is transmitted.

To address this issue, the LTE eNB may configure a restricted CSI measurement set for the LTE UE. In this case, in order to prevent the NR system from transmitting NR data for a slot overlapping the subframe(s) corresponding to CSI subframe set 0 (or set 1), the LTE eNB may indicate, to the NR gNB, the slot region as a reserved resource or a blank resource.

In particular, the LTE-DRS protection method proposed in this section may be applied even to an LTE CSI-RS configured for RRM measurement or an LTE CSI-RS configured for CSI measurement.

For example, the NR system may not attempt separate transmission in the CSI-RS resource region of the LTE system. As a specific method for this operation, the CSI-RS of the LTE system exchanges the information about the symbol region in which the CSI-RS of the LTE system is to be transmitted may be exchanged between the LTE base station and the NR base station, and the NR base station recognizing the information may inform the NR UE that the symbol region is a blank resource through signaling, and indicate whether DL and/or UL data is punctured or rate-matched for the symbol region.

Alternatively, in the symbol region where the CSI-RS is transmitted, the RE/RB regions other than the REs in which the CSI-RS is transmitted may be utilized for signal transmission in the NR system. In this case, in order to indicate the corresponding LTE CSI-RS configuration, the NR gNB may directly transmit the configuration information defined in the LTE system to the NR UE. Alternatively, if there is information about a configuration that is identical to or may include the LTE CSI-RS configuration among the NR CSI-RS configuration(s), the NR gNB may indicate the information about the corresponding NR CSI-RS configuration(s) to the NR UE. Additionally, the NR gNB may indicate, to the NR UE, whether or not the DL and/or UL data is punctured or rate-matched for the corresponding LTE (or NR) CSI-RS RE or RB region.

3.1.4. RRM Measurement Method of NR System

An NR SS transmitted using a method described in detail in section 3.2 below may be utilized for RRM measurement of the NR system. Alternatively, an RS for use in measurement may be transmitted using a method proposed in section 3.2 below and be utilized for RRM measurement of the NR system.

In addition, the UE may be configured to perform RRM measurement on the corresponding carrier using the LTE CRS (and/or LTE CSI-RS) and to report the measurement result to the NR base station. At this time, the DC tone in DL transmission in the LTE system may be nulled, whereas the DC tone in DL transmission in the NR system may be handled in the same way as other subcarriers at least in view of the transmitter.

At this time, when the NR UE performs RRM measurement based on the LTE CRS, the NR UE may require signaling about the DC tone of the LTE system or the center frequency of the LTE system to correctly identify RE mapping of the CRS.

In addition, the LTE CRS-based RRM measurement result may be averaged and reported together with the NR signal-based RRM measurement result on the corresponding carrier, or may be reported independently of the LTE CRS-based RRM result.

In addition, the NR UE may receive an indication of an NR measurement RS port that may be mapped to each antenna port of the LTE CRS or be assumed to have a QCL (Quasi Co-Located) relationship therewith.

3.2. Synchronization Signal Transmission

In this section, a method of transmitting a synchronization signal (SS) of an NR system at a carrier frequency at which the NR system and the LTE system coexist is described in detail.

3.2.1. First SS Transmission Method

The NR gNB may transmit an NR SS using an MBSFN subframe or a TDD UL subframe (or an UpPTS region). The LTE eNB may not schedule the LTE UE during the corresponding region, and the NR gNB may transmit the NR SS during the corresponding region because the CRS, which is required to be periodically transmitted through the full band, is not included in the corresponding region.

However, in this case, the transmission period (e.g., 5 ms) for transmission of the NR SS may not be guaranteed. Thus, the NR SS transmission period of the corresponding carrier frequency band may be separately configured.

At this time, if the UE performs initial access on a specific carrier, the NR SS transmission period may be set for the specific carrier, and thus the NR SS reception performance of the UE may be degraded. Therefore, the carrier (or cell) on which the NR SS is transmitted may be restricted to be configured as a secondary cell only. In this case, the NR SS period of the SCell may be indicated in the PCell (or PSCell (Primary SCell)).

The legacy LTE system has an SF index which cannot be configured as an MBSFN SF such as SF #0 or SF #5, in which the SSS is transmitted. However, this condition may vary depending on whether the carrier is an FDD carrier or a TDD carrier.

Accordingly, if the NR system operates at a carrier frequency at which the LTE system operates, the SS (and/or PBCH) of the NR system may be transmitted using the LTE MBSFN SF of the carrier frequency.

Alternatively, if the index of a slot in which the SS (and/or PBCH) of the NR system is transmitted is pre-defined or is separately set, an LTE subframe index and a separate index may be set for the UE as information for indicating a resource in which the NR SS is transmitted.

For example, in the case where the SS (and/or PBCH) of the NR system is configured to be transmitted in slot index #0, and the MBSFN SF is configured in SF #3 and SF #8 of the LTE system, SF #3 of the LTE system may be aligned with slot index #0 of the NR system.

In particular, a UE that causes both NR and NR systems to operate on a carrier (or a frequency band) on which signals such as the NR SS are transmitted needs to recognize the mapping relationship between the LTE SF index and the NR slot index.

Accordingly, for example, if the UE determines an SF index or a slot index in which the UE will actually attempt UL transmission according to a timing relationship between UL transmissions (e.g., HARQ-ACK transmission after PDSCH reception or PUSCH transmission after UL grant reception), the UE may utilize the mapping relationship between the LTE SF index and the NR slot index.

To this end, the information about the mapping relationship between the LTE SF index and the NR slot index may be signaled to the UE. As a method for this, an offset between the LTE SF index and the NR slot index may be indicated (by L1 signaling or higher layer signaling).

3.2.2. Second NR SS Transmission Method

In an X MHz available carrier frequency band, the LTE system may be operated in the X' MHz band, which is less than X MHz (where X'<X). In this case, the NR gNB may transmit the NR SS using the remaining frequency resources.

For example, if an LTE system is operated in a 15 MHz band in a 20 MHz (X=20) available carrier frequency band, there may be available frequency resources of about 2.5 MHz on both sides of the 15 MHz (X'=15) band. Thus, the NR gNB may utilize the 2.5 MHz resources for NR SS transmission.

A channel raster capable of receiving an NR SS in a NR UE may be sparser than the legacy LTE (100 kHz). In other words, the size of the channel raster corresponding to the NR SS may be set to be larger than the size of the channel raster in the legacy LTE system. Here, if the channel raster corresponding to the NR SS is excessively coarse, the NR SS may not be transmitted within a certain frequency band (e.g., 2.5 MHz). Therefore, for a carrier frequency band in which the NR SS is transmitted, this issue may need to be considered in designing a raster.

Figure 17:
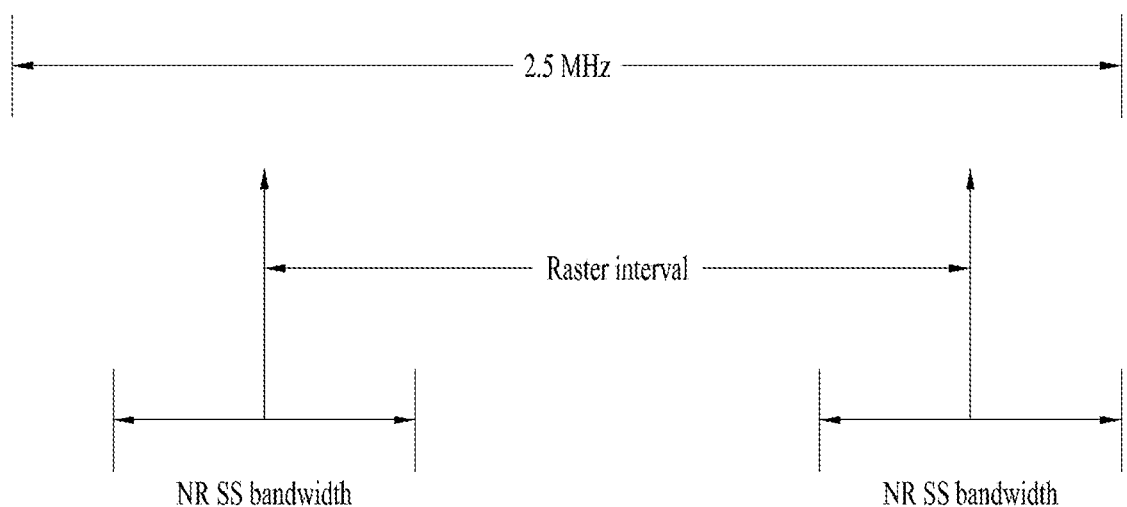
FIG. 17 is a diagram illustrating a configuration in which an NR SS is transmitted in a certain frequency band according to the present invention.

FIG. 17 is a diagram illustrating a configuration in which an NR SS is transmitted in a certain frequency band according to the present invention.

As shown in FIG. 17, according to an embodiment of the present invention, a raster spacing may be configured such that the NR SS is transmitted up to K (e.g., K=2) times within 2.5 MHz.

3.2.3. Third NR SS Transmission Method

In this section, unlike the first NR SS transmission method (transmitting the NR SS in a region where the LTE CRS is not transmitted, such as an MBSFN SF or a TDD UL SF) described above, an embodiment in which the NR SS transmission is defined in a region (e.g., a subframe) in which the LTE CRS is transmitted is proposed.

However, according to the embodiment proposed in this section, if the NR SS transmission region overlaps the LTE CRS (and/or the LTE SSS and/or the PSS and/or the LTE PBCH and/or the LTE CSI-RS and/or the DC carrier), puncturing may be performed for the corresponding overlapping REs and thus the NR SS may not be transmitted.

3.3. URLLC Assistance Method

When the eNB and the gNB are co-located, the gNB may communicate with an LTE UE rather than an NR UE at a specific point in time for a part or the entirety of the system bandwidth. For example, if some subframes in a radio frame composed of 10 subframes are configure as MBSFN subframes from the perspective of the LTE system, the gNB may communicate with NR UEs during the 12-symbol time region excluding the first two symbols in the MBSFN subframes and communicate with LTE UEs in the remaining subframes.

In this case, considering URLLC, which is one of the most important use cases in the NR system, even if signal transmission/reception with an LTE UE is scheduled at a certain subframe time at which URLLC data to be transmitted urgently exists, URLLC data transmission to the corresponding NR UE must be supported.

As a specific example for addressing this issue, the gNB may support URLLC transmission using the entire LTE subframe or only some symbols thereof. To this end, a CRS symbol in which the CRS is transmitted in the DL subframe of the LTE system may be basically considered. In the LTE system, the CRS may be utilized for CSI/RRM measurement or the like, and therefore URLLC data may be transmitted avoiding the corresponding symbols.

Figure 18:
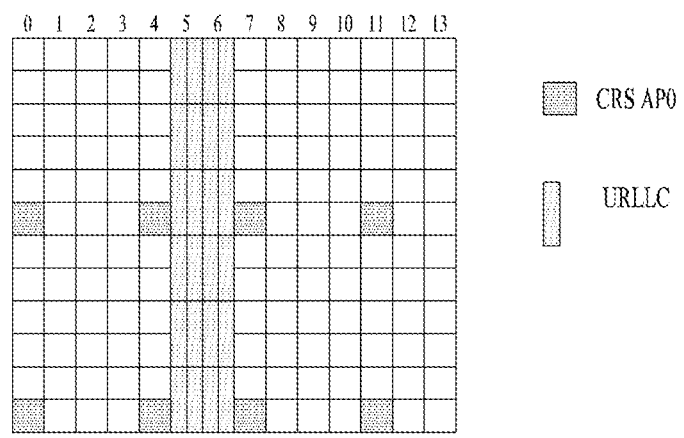
FIG. 18 is a diagram schematically illustrating a configuration in which URLLC is transmitted according to an embodiment of the present invention.

FIG. 18 is a diagram schematically illustrating a configuration in which URLLC is transmitted according to an embodiment of the present invention.

For example, as shown in FIG. 18, the NR gNB may transmit URLLC data by configuring a transmission time interval (TTI) using only two OFDM symbols in which no CRS is transmitted.

Figure 19:
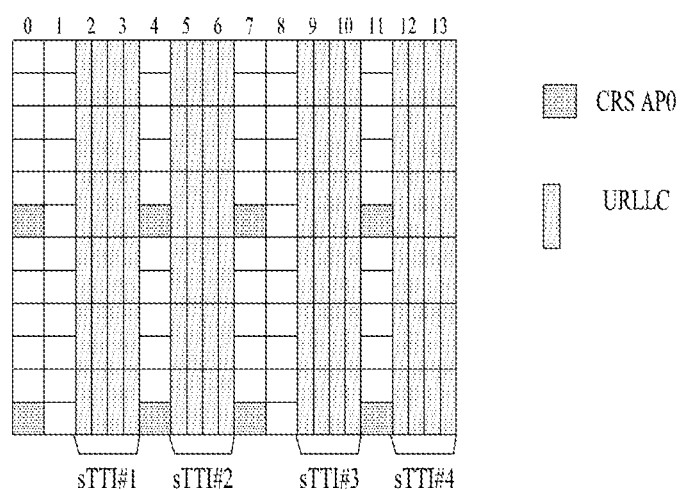
FIG. 19 is a diagram schematically illustrating a configuration in which URLLC is transmitted according to another embodiment of the present invention.

FIG. 19 is a diagram schematically illustrating a configuration in which URLLC is transmitted according to another embodiment of the present invention.

In another embodiment, as shown in FIG. 19, the NR gNB may pre-configure a short TTI (sTTI) so as not to overlap the CRS symbols. In response, the NR UE may expect URLLC data reception even if an LTE service is configured to be provided in the corresponding subframe.

As an example of this operation, in a 15 kHz subcarrier spacing-based LTE subframe structure, when OFDM symbols #2/#3 are configured as sTTI #1, OFDM symbols #5/#6 are configured as sTTI #2, OFDM symbols #9/#10 are configured as sTTI #3, and OFDM symbols #12/#13 are configured as sTTI #4, the NR UE may expect to receive URLLC data in the four sTTIs in the corresponding subframe.

Such proposed methods are applicable even to a configuration in which a gNB transmits URLLC data, excluding CRS symbols from some frequency resources in a subframe serving the LTE UE for a part of the system bandwidth. Accordingly, the transmission bandwidth of the URLLC may be greater than the system bandwidth of the gNB, and the URLLC data may be transmitted in a manner of puncturing the LTE carrier. This transmission method may be limited to a symbol in which the CRS or PSS/SSS of the LTE carrier is not transmitted. In a symbol in which the CRS or PSS/SSS is not transmitted, URLLC DL and UL transmissions may all be applied, and a signal transmission method using a sidelink scheme may also be applied.

When URLLC transmission is supported using the entirety of an LTE subframe or only some symbols thereof, the proposed method described above is applicable not only to a DL subframe but also to a UL subframe and/or a special subframe. For example, when a TTI region for URLLC transmission is configured for a region of some symbols (or 1 subframe) in the UL subframe, the UpPTS, or the guard period, the NR UE may expect to receive URLLC data in the configured TTI region.

3.4. UL Transmission

UL transmission multiplexing of the NR UE and the LTE UE may have different TX numerologies and the like for different systems. Therefore, the NR UE and the LTE UE may use FDM/TDM as a UL transmission multiplexing scheme. . To this end, it may be necessary to exchange UL scheduling information between the base stations (e.g., the LTE eNB and the NR gNB). Considering that it may be difficult to dynamically perform information exchange due to the nature of coordination between base stations, the LTE eNB may signal, to a neighbor gNB, a (potential) PUCCH region, a frequency region (e.g., an RB unit) for scheduling the PUSCH during a certain period, or the like. The NR gNBs receiving the signaling may schedule UL transmissions of NR UEs in the remaining time/frequency domain, excluding the corresponding time/frequency region.

Alternatively, the LTE eNB may signal, to a neighbor NR gNB, a time/frequency region which the neighbor NR gNB is allowed to use without any problem. The NR gNBs receiving the signaling may schedule UL transmissions of NR UEs only in the corresponding time/frequency resources.

For LTE PUSCH transmission, frequency hopping on a slot-by-slot basis (or a subframe-by- subframe basis) may be configured. In this case, the hopping information may also be transmitted to the neighbor gNB. For example, if the LTE eNB signals to the neighbor gNBs to indicate that type 1 PUSCH hopping is to be used, the gNB may also allocate frequency resources in the same pattern as the type 1 PUSCH hopping. Thereby, an FDM gain between the different systems may be acquired.

At this time, if synchronization between the LTE cell and the NR cell is not correctly set, UL transmissions of the NR UEs may be scheduled considering the timing uncertainty. The NR gNB receiving the signaling about the transmission time/frequency resources of the LTE PUSCH and/or the LTE PUCCH and/or the LTE PRACH may signal UL transmissions of the NR UEs considering time/frequency resources in two slots (or two subframes) which may overlap the corresponding slots (or two subframes).

In the NR system, UL control channels may be designed to be present in the last time region within a specific time interval as in the example of FIG. 11, and the corresponding region may overlap the Sounding Reference Signal (SRS) transmission time region of an LTE eNB coexisting in a neighbor cell. Therefore, exchange of information between the eNB and the gNB may be needed to reduce interference between the LTE SRS and the NR UL control channels. For example, similar to the exchange of valid or invalid PUSCH assigned frequency resource information, the LTE eNB may signal SRS resources (RB-unit frequency resources) in which UCI transmission of a neighbor NR gNB is allowed or not allowed from the perspective of the LTE eNB.

At this time, SRS configuration information of the LTE system may be utilized as an example of the signaled information. In one example, cell-specific SRS configuration information and UE-specific SRS configuration information of the neighbor LTE eNB may be signaled. Here, the UE-specific SRS configuration may refer to SRS resources available to the NR gNB for UCI transmission, and the cell-specific SRS configuration resources (excluding the UE-specific SRS configuration resources) may refer to resources that the NR gNB should not utilize for UCI transmission in consideration of SRS transmission of the LTE eNB.

As described above, if synchronization between the LTE cell and the NR cell is not correctly set, the UL transmissions of the NR UEs may be scheduled considering the timing uncertainty. Accordingly, the NR gNBs receiving the signaling about the transmission time/frequency resources of the LTE SRS may signal the UL transmissions of the NR UEs considering the time/frequency resources of 2 symbols that may overlap the corresponding symbols.

Alternatively, the NR gNB may restrict UL transmission of NR for all symbols that may overlap the symbol in which the LTE SRS is transmitted. In other words, the NR gNB may schedule the UL transmissions of NR UEs only in the remaining symbols except for all symbols that may overlap the symbol in which the LTE SRS is transmitted.

3.5. Dual Connectivity Between NR System and LTE System

Proposed in this section is a method for NR/LTE coexistence in a dual connectivity situation where an LTE system and an NR system are connected by a non-ideal backhaul link and common MAC (Medium Access Control) is not configured between the LTE system and the NR system. However, the method described below is equally applied to a situation where the LTE system and the NR system are connected by an ideal backhaul link or are co-located.

Figure 20:
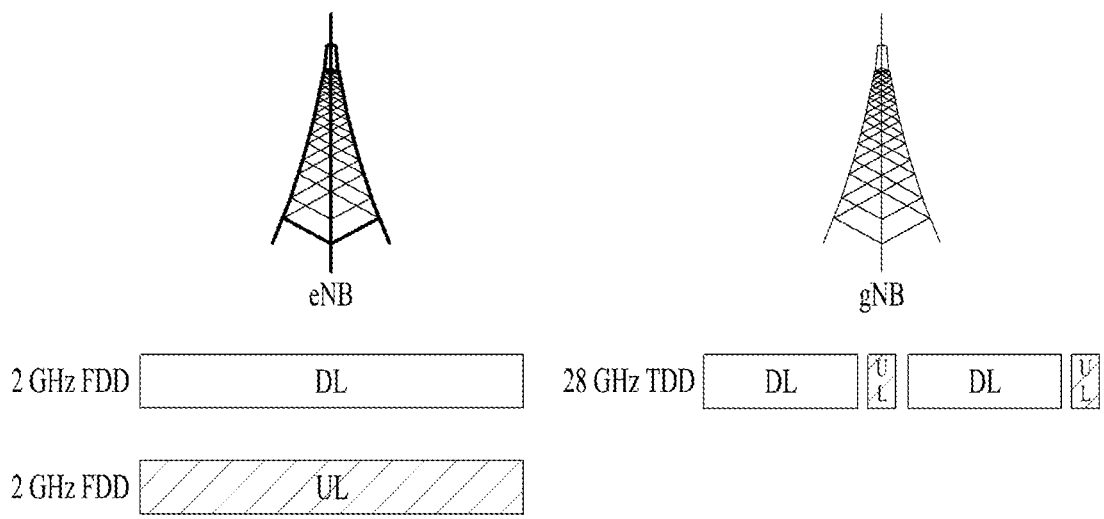
FIG. 20 is a diagram schematically illustrating a configuration in which a specific UE is dual-connected to an LTE eNB and an NR gNB according to an embodiment of the present invention.

FIG. 20 is a diagram schematically illustrating a configuration in which a specific UE is dual-connected to an LTE eNB and an NR gNB according to an embodiment of the present invention.

As shown in FIG. 20, when a specific UE is dual-connected to an LTE eNB and an NR gNB, the LTE eNB may operate in the FDD (or paired spectrum) in the 2 GHz band and the NR gNB may operate in the TDD (or unpaired spectrum) in the 28 GHz band.

At this time, it may be common for a network to have a lot of DL traffic compared to UL traffic. Accordingly, if the DL traffic is heavy on the NR carrier, the resource region in which UL transmission is allowed may not be large. However, in view of the LTE network, resources of the UL carrier may be inefficiently used due to the relatively small UL traffic.

In such a situation, it may be useful in terms of resource utilization that the UE transmit UL data or UL control to be transmitted to the NR gNB on an LTE carrier rather than an NR carrier.

Alternatively, if the number of antennas of the UE is relatively small compared to the network, and thus the coverages of the DL and the UL are considerably different from each other, the UE may repeat transmission of a signal at the NR frequency more than necessary, and thus many UL resources may be needed.. If the number of UEs is small, it may not be effective to time-divide DL and UL for these UEs. Therefore, for such UEs, it may be useful to offload UL using an LTE frequency. This configuration may also be applied to offloading the NR DL using the DL of the LTE frequency. Hereinafter, for simplicity, description will be given focusing on UL transmission as a technical configuration applicable to the present invention.

Hereinafter, methods for transmitting, on an LTE UL carrier, HARQ-ACK information (and/or CSI information and/or scheduling request information, which will be referred to as uplink control information (UCI) for simplicity) corresponding to DL data received on the NR carrier by the UE will be proposed. These methods may be similarly applied to the data transmission method of the UE. In addition, in the case of SRS transmission of the UE, the UE may be configured to transmit the SRS on an LTE UL carrier for quality measurement of UL.

3.5.1. First UCI Transmission Method

According to the first UCI transmission method proposed by the present invention, an SF for transmitting UCI corresponding to the NR carrier and an SF for transmitting UCI corresponding to the LTE carrier may be subjected to TDM from the perspective of a specific UE.

Figure 21:
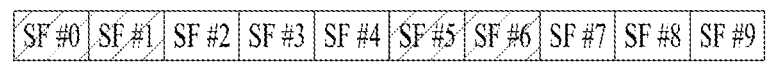
FIG. 21 is a diagram illustrating a configuration in which an SF in which UCI corresponding to an NR carrier is transmitted and an SF in which UCI corresponding to an LTE carrier are subjected to TDM according to an embodiment of the present invention.

FIG. 21 is a diagram illustrating a configuration in which an SF in which UCI corresponding to an NR carrier is transmitted and an SF in which UCI corresponding to an LTE carrier are subjected to TDM according to an embodiment of the present invention.

As shown in FIG. 21, in an example applicable to the present invention, SFs #0, #1, #5, and #6 may be defined as a set of SFs for transmitting UCI corresponding to the LTE carrier, and SFs #2, #3, #4, #7, #8, and #9 may be defined as a set of SFs for transmitting UCI corresponding to the NR carrier. Such set information may be configured by L1 signaling or higher layer signaling.

Specifically, the UE may transmit UCI corresponding to the LTE carrier in the earliest SF (in which the UCI corresponding to the LTE carrier may be transmitted) after the SF configured by a timing preset on the LTE FDD carrier or in a specific SF configured by a predetermined rule after an SF configured by the timing preset on the LTE FDD carrier. As shown in FIG. 21, if a rule is configured in advance such that the UCI corresponding to the LTE PDSCH received in SF #0 is transmitted in SF #4, the UE may actually feed back the UCI in SF #5 because SF #4 is configured to transmit UCI corresponding to the NR carrier. Similarly, the UE may transmit UCI corresponding to the NR carrier in the earliest SF (in which the UCI corresponding to the NR carrier may be transmitted) after the SF configured by a timing preset on the NR carrier.

Alternatively, as a method for providing a UE with more UCI transmission opportunities corresponding to the LTE carrier (or the NR carrier), a set of SFs in which only UCI transmission corresponding to the LTE carrier (or the NR carrier) is allowed may be defined separately. In this case, in the remaining SFs, both transmission of the UCI corresponding to the LTE carrier and transmission of the UCI corresponding to the NR carrier may be allowed.

Alternatively, such set information may be utilized to designate a priority of UL to be transmitted to LTE or NR. For example, in SFs configured for LTE, the UL transmitted to the LTE eNB may be interpreted as having a higher priority.

The configuration described above and a UCI transmission method of a UE to be described later are more clearly described below.

First, the first UCI transmission method described above may mean a method in which LTE UCI and NR UCI are not multiplexed.

According to the method, it may be assumed that each UCI (for example, UCI for the LTE system and UCI for the NR system) is transmitted on a different channel or a different resource. This scheme may be useful when the LTE eNB and the NR gNB process data through different processing units. This scheme may mean exclusive TDM between two RATs.

Next, UCI transmission methods to be described later may refer to a method in which LTE and NR UCI are multiplexed.

According to the method above, UCIs may be multiplexed with each other like aggregation of an NR carrier and an LTE carrier. At this time, as an example of the A/N stacking scheme, the stacking scheme of the legacy PDCCH and ePDCCH may be applied to LTE and NR data. Accordingly, the UE may process A/N bits of LTE and NR using methods scheduled on different control channels.

Alternatively, the UE may not know the number of data scheduled by the LTE and the NR or the expected number of A/N bits. In this case, the UE may pre-receive configuration of the number of NR/LTE A/N bits through higher layer signaling (e.g., RRC signaling) and assume to fill the corresponding part with, for example, A/N bits and padding bits (see Section 3.5.3 below)

Alternatively, when the UE piggybacks the UCI on the PUSCH, the UE may configure UCI mapping differently for the LTE and the NR (See Section 3.5.4.1 below).

The configuration as to which of the above two methods is applied may be indicated through higher layer signaling.

When the TDM scheme is assumed as described above, a timing advance (TA) value may be separately assumed for the NR UL and the LTE UL. That is, for UL transmission in an SF corresponding to LTE, the UE may apply a TA value set for the LTE UL. For UL transmission in an SF corresponding to NR, the UE may apply a TA value set for the NR UL.

3.5.2. Second UCI Transmission Method

According to the second UCI transmission method proposed by the present invention, an SF for transmitting UCI corresponding to the NR carrier and an SF for transmitting UCI corresponding to the LTE carrier may be subjected to FDM from the perspective of a specific UE. In this case, the UE must be capable of supporting such FDM in advance for the method above.

For example, when 1 or 2 bits of HARQ-ACK corresponding to an NR carrier are transmitted, the UE may transmit UCI on the LTE UL carrier using PUCCH format 1a/1b. At this time, it may be difficult to apply an implicit rule such as utilizing a PUCCH resource corresponding to the lowest CCE of the PDCCH as in the legacy LTE, and therefore a PUCCH resource (for each SF) may be pre-defined. The PUCCH resource configuration method may be applied even to UCI transmission methods other than the second UCI transmission method.

When the UE transmits UCI using PUCCH formats 3/4/5, PRB(s) for transmitting the PUCCH are determined according to the value of an acknowledgment resource indicator (ARI) field. At this time, a candidate set of resources for transmitting UCI corresponding to the LTE carrier and a candidate set of resources for transmitting UCI corresponding to the NR carrier, which are indicated through the ARI (per PUCCH format), may be configured so as not to overlap each other.

Specifically, when there are both the UCI corresponding to the NR carrier and the UCI corresponding to the LTE carrier present in the same SF, the UE may select PUCCH formats and PUCCH resources for transmitting the two types of UCI individually, and transmit the UCI using each PUCCH format and/or each PUCCH resource. For example, FDM may be performed in the same SF such that the UCI corresponding to the NR carrier is transmitted through PUCCH format 3 in PRB #K, and the UCI corresponding to the LTE carrier is transmitted through PUCCH format 1 in PRB #M. Transmitting different PUCCHs in the same SF may be defined as a UE capability.

This scheme may also be applied to PUCCH and PUSCH. In this case, however, there may be restrictions that the UE should be capable of simultaneous transmission of the PUCCH/PUSCH. In this case, if a UE capable of the simultaneous PUCCH/PUSCH transmission receives such a configuration, a combination of LTE PUCCH/NR PUCCH LTE PUSCH/NR PUCCH LTE PUCCH/NR PUSCH may be possible for the UE (See Section 3.5.4.2 below).

Here, the following details may be considered as a method for processing UCI piggyback in the NR system.

(1) When NR UCI piggyback is possible even on LTE PUSCH

All NR UCIs or certain UCIs may be piggybacked on the LTE PUSCH, and an NR channel corresponding to NR UCI transmission (e.g., NR-PUCCH) may be omitted. If only specific UCI (e.g., CSI information) is allowed to be piggybacked, the remaining UCIs (e.g., HARQ-ACK information) may still be transmitted on the NR-PUCCH.

(2) When NR UCI piggyback is possible only on NR PUSCH

When a UE is power-limited on an NR UL carrier, the UE may be allowed to transmit specific UCI (e.g., CSI information and/or HARQ-ACK information) or all UCIs on the LTE UL carrier. In this case, the UE may perform NR-PUCCH transmission or NR-PUSCH transmission on the LTE UL. In this case, the UE may assume that the NR-PUCCH/NR-PUSCH resources are pre-configured or configured by a DL grant. That is, whether the UE will transmit the UCI on the NR UL or on the LTE UL may be dynamically configured.

3.5.3. Third UCI Transmission Method

According to the third UCI transmission method proposed by the present invention, UCI corresponding to an NR carrier and UCI corresponding to an LTE carrier may be transmitted through the same PUCCH resource.

For example, if the sum of the two types of UCI bits is less than or equal to 22 bits, UCI to which Reed-Muller (RM) coding is applied may be transmitted using LTE PUCCH format 3. At this time, as a method of configuring an input bit stream, the UCI corresponding to the LTE carrier may be arranged first and then the UCI corresponding to the NR carrier may be arranged. Alternatively, the UCI corresponding to the NR carrier may be arranged first and then the UCI corresponding to the LTE carrier may be arranged.

At this time, due to the non-ideal backhaul, it may not be easy for the LTE eNB to know whether there is UCI corresponding to the NR carrier among the UCIs transmitted by the UE. In this case, in order to reduce blind detection burden from the perspective of the LTE eNB, the bit size of the UCI corresponding to the NR carrier between the UCIs transmitted by the UE may be fixed to a preset value.

As another example, if the sum of the two types of UCI bits is greater than 22 bits or PUCCH format 4 is determined as the PUCCH format for UCI transmission by an LTE PUCCH format adaptation rule, tail biting convolutional coding (TBCC) may be applied to the two types of UCI bits. At this time, as a method of configuring an input bit stream, the UCI corresponding to the LTE carrier may be arranged first and then the UCI corresponding to the NR carrier may be arranged. Alternatively, the UCI corresponding to the NR carrier may be arranged first and then the UCI corresponding to the LTE carrier may be arranged. Common parity bits may then be added.

Alternatively, parity bits may be added to each of the two types of UCI. In this case, in order to reduce the blind detection burden on the LTE eNB, the bit size of the UCI corresponding to the NR carrier between the UCIs transmitted by the UE may be fixed to a preset value.

When the UCI corresponding to the NR carrier is transmitted on the LTE carrier in a single container (e.g., a single PUCCH format or the like) according to the UCI transmission methods described in sections 3.5.1 and 3.5.2 above, the UCI information may be configured in a MAC protocol data unit (PDU). For example, a MAC header according to each UCI type (e.g., HARQ-ACK, CSI, scheduling request (SR), beam related information, etc.) may be inserted into UCI information on the NR MAC, and a MAC control element (CE) may be configured. Then, the UCI information may be transmitted on the PUSCH (or PUCCH format 4 or 5) on the LTE carrier through the LTE PHY. The information about PUSCH resources on the LTE carrier may be configured, or a specific LTE UL resource may be indicated on the NR carrier through the DCI information.

3.5.4. Fourth UCI Transmission Method

If the PUSCH is scheduled in an SF in which the UCI information is to be transmitted, the UCI information may be piggybacked on the PUSCH. Hereinafter, a method for piggybacking UCI corresponding to an NR carrier and UCI corresponding to an LTE carrier will be described in detail.

3.5.4.1. First Piggyback Method

Figure 22:
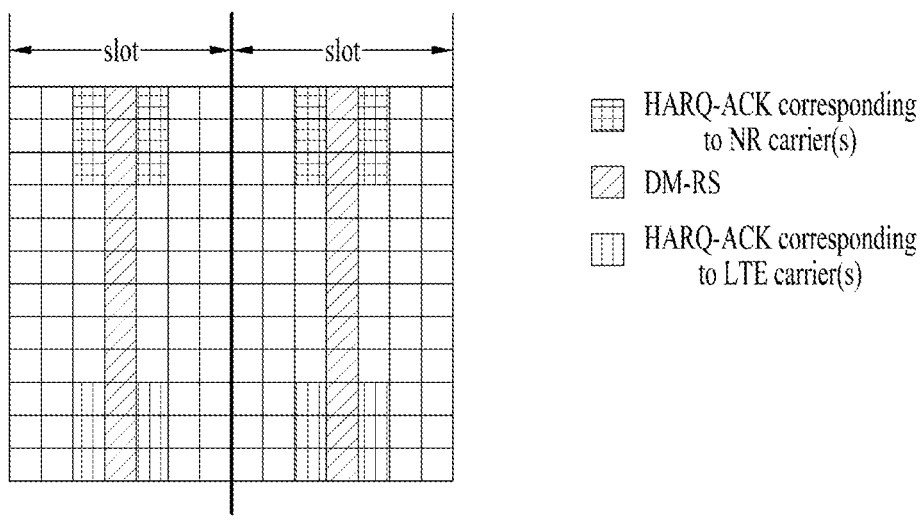
FIG. 22 is a diagram schematically illustrating a configuration in which UCI corresponding to an NR carrier and UCI corresponding to an LTE carrier are piggybacked on the same PUSCH according to an embodiment of the present invention.

FIG. 22 is a diagram schematically illustrating a configuration in which UCI corresponding to an NR carrier and UCI corresponding to an LTE carrier are piggybacked on the same PUSCH according to an embodiment of the present invention.

As shown in FIG. 22, the UCI corresponding to the NR carrier and the UCI corresponding to the LTE carrier may be allowed to be piggybacked on the same PUSCH, but mapping of the UCI corresponding to the NR carrier onto the PUSCH may be defined differently from mapping of the UCI corresponding to the LTE carrier onto the PUSCH.

More specifically, as shown in FIG. 22, a rule may be configured such that HARQ-ACK bits corresponding to the NR carrier are positioned around the DM-RS, but mapping thereof is performed in the opposite direction (reverse order) of mapping of HARQ-ACK bits corresponding to the LTE carrier in the frequency dimension.

3.5.4.2. Second Piggyback Method

A rule may be configured such that a UE configured for PUCCH/PUSCH simultaneous transmission piggybacks only UCI information corresponding to the LTE carrier on the PUSCH and transmits UCI corresponding to the NR carrier on the PUCCH. Alternatively, a rule may be configured such that the UE piggybacks only the UCI information corresponding to the NR carrier on the PUSCH and transmits the UCI corresponding to the LTE carrier on the PUCCH. In this case, it may be difficult for the LTE eNB to know whether or not the UCI corresponding to the NR carrier is present on the corresponding LTE PUSCH, and therefore all UCI information may be punctured and piggybacked on the LTE PUSCH.

The various UL transmission methods described above may be similarly applied to a DL transmission method. However, in this case, it is necessary for the UE to distinguish whether the transmitted signal is intended for the NR system or for the LTE system. This distinguishment may be performed based on the transmission scheme (e.g., the resource region of the PDCCH may be configured differently between NR and LTE), RNTI, the numerology, or the HARQ process ID. Here, it may be assumed that initial transmission and retransmission come from one RAT (i.e., the LTE eNB excludes initial transmission and the NR gNB excludes retransmission), or the HARQ process ID may be configured differently for each RAT if the HARQ process is shared.

Correspondingly, when one carrier is used by two RATs, the UE may assume that both RATs are transmitted/received in the form of TDM or FDM or that one carrier is always used by one RAT.

When the UE transmits the UCI information corresponding to the NR carrier on the LTE carrier according to the various methods described above, it may be difficult for the NR system (or the NR carrier) to dynamically signal a resource on the LTE carrier through which the UCI information should be transmitted (due to the non-ideal backhaul). Therefore, the information about resources in the LTE carrier through which the UCI information corresponding to the NR carrier is transmitted may be indicated through a dynamic indication (e.g., DCI) transmitted through the LTE carrier of the LTE system. As an example, the information may be triggered through a new DCI format or may be triggered through an explicit (or implicit) indicator using a conventional UL grant.

Alternatively, a specific time-frequency resource may be semi-statically configured as a resource in the LTE carrier on which the UCI information corresponding to the NR carrier is transmitted. In this case, if only UCI information characteristically corresponding to the NR carrier is present, the UE may transmit the UCI information through the semi-statically configured resources. On the other hand, if only UCI information corresponding to the LTE carrier is present or both the UCI information corresponding to the LTE carrier and the UCI information corresponding to the NR carrier are present, the UE may transmit all of the UCI information on the PUCCH resource (or PUSCH resource) of the LTE carrier.

3.6. UE Capability

Regarding the various methods for coexistence of the LTE system and NR system described above, the network may configure possible coexistence methods. Alternatively, a method for coexistence of the LTE system and the NR system may be defined according to the UE capability, and thus the supportable coexistence method may differ among specific UEs. Given these considerations, at least the following items may be defined as the UE capability.

Methods for protecting LTE DRS (e.g., RE level muting/puncturing/rate-matching methods, symbol level muting/puncturing/rate-matching methods)

Whether LTE DRS can be received (for example, whether RRM measurement can be performed on the NR system using the LTE DRS)

Whether the NR UE can transmit an LTE signal through the NR carrier (e.g., whether the UE can transmit LTE SRS/PUCCH/PUSCH or the like.)

In addition, a series of signaling may be introduced to inform a specific UE (e.g., NR UE) of available resources for a carrier/cell/frequency band in which the LTE system and the NR system coexist may be introduced in view of the network. For example, availability may be indicated for each subframe/slot. In addition, an indication may be given such that non-MBSFN SFs are not available to the NR UE and MBSFN SFs are available to the NR UE.

As another example, a DL/UL link direction may be configured for each set of some subframes/slots. For example, one of types of DL only, DL dominant, UL dominant, and UL only may be configured as the DL/UL link direction for each subframe/slot. In this case, DL only, DL dominant, UL dominant, and UL only may all be configured for a subframe configured as MBSFN with respect to the LTE TDD DL subframe (or configured MBSFN in common for all neighbor cells), and only the types such as DL dominant and UL dominant may be configured for a special subframe.

In addition, signaling for available time/frequency resources may be introduced in each subframe/slot.

Further, a method of informing a UE of available resources may be defined differently according to the capability of each UE. For example, for a UE capable of RE (or subcarrier) level muting for LTE DRS protection, the proposed center frequency-related signaling of LTE may be further introduced. As another example, for a UE capable of LTE SRS transmission, signaling of more specific information (e.g., SRS bandwidth, SRS comb index, SRS cyclic shift index, etc.) for the SRS transmission may be introduced.

In FIG. 20, the NR gNB may be equipped with a function to receive UL transmission at 2 GHz. In other words, the NR gNB may receive UL transmissions even at 2 GHz at which the LTE eNB is capable of reception. In this case, the UE may transmit UL data or a UL control signal through an NR numerology (e.g., larger subcarrier spacing, Cyclic Prefix (CP)-OFDM, transmission without a 7.5 kHz shift, etc.) according to the capabilities of the UE even if the carrier is the LTE carrier.

In this case, a set of SFs for transmission according to the LTE numerology may be pre-configured to allow the LTE eNB to receive signals and a set of SFs for transmission according to the NR numerology may be pre-configured to allow the NR gNB to receive signals. For example, as shown in FIG. 21, SFs #0/#1/#5/#6 may be configured as a set of SFs for transmission according to the LTE numerology to allow the LTE eNB to receive signals, and SFs #7/#8/#9 may be configured as a set of SFs for transmission according to the NR numerology to allow the NR gNB to receive signals. In addition, changing the numerology to the SF level in the time dimension may also be defined as the UE capability from the perspective of the same UE.

In addition, as described above, an LTE signal and an NR signal may be subjected to TDM or FDM. For example, when LTE PUSCH and NR UL data are simultaneously scheduled in SF #K, the UE may transmit the LTE PUSCH and the NR UL data using a numerology configured by each system in each corresponding frequency region, which may be defined as the UE capability.

Specifically, whether or not the UE can simultaneously transmit signals having different subcarrier spacings on the same carrier at the same time may be defined as the UE capability. Alternatively, whether or not the UE can simultaneously transmit signals having different waveforms (e.g., an OFDM signal and a DFT-s-OFDM signal) on the same carrier at the same time may be defined as the UE capability.

Hereinafter, a UCI transmission method for a UE applicable to the present invention will be described among the various configurations described above. It is assumed that an NR base station (e.g., NR gNB) and an LTE base station (e.g., LTE eNB) are connected to each other through dual connectivity (e.g., the non-ideal backhaul), and the UE transmits UCI for the two base stations.

First, the UE receives a first DL signal from the NR base station and a second DL signal from the LTE base station. At this time, the NR base station may operate in TDD and the LTE base station may operate in FDD. Here, the frequency band in which the NR base station operates in TDD may be different from the frequency band in which the LTE base station operates in FDD. For example, the frequency band in which the NR base station operates in TDD may be the 28 GHz band, and the frequency band in which the LTE base station operates in FDD may be the 2 GHz band.

Here, in the present invention, it is assumed that the NR base station and the LTE base station share a carrier having a predetermined frequency range to receive an uplink signal transmitted from the UE. For example, the carrier shared by the NR base station and the LTE base station may be a UL carrier of the LTE system. In this case, the UE uses the carrier shared by the NR base station and the LTE base station to transmit first UCI corresponding to the first DL signal and second UCI corresponding to the second DL signal.

For example, the time interval in which the first UCI is transmitted and the time interval in which the second UCI is transmitted may be subjected to time division multiplexing (TDM). In other words, the UE may transmit the first UCI and the second UCI in the TDM scheme. At this time, the first UCI may be transmitted to the NR base station, and the second UCI may be transmitted to the LTE base station.

In the example above, the UE may receive, through higher layer signaling, information about the time interval during which the first UCI may be transmitted and a time interval during which the second UCI may be transmitted (see FIG. 21). In this case, the UE may transmit the first UCI in the earliest time interval after a predetermined time from the time point at which the first downlink signal is received in the time interval during which the first UCI may be transmitted.

In another example, the frequency band in which the first UCI is transmitted and the frequency band in which the second UCI is transmitted may be subjected to frequency division multiplexing (FDM). In other words, the UE may transmit the first UCI and the second UCI in the FDM scheme. At this time, the first UCI may be transmitted to the NR base station, and the second UCI may be transmitted to the LTE base station.

In the example above, the UE may determine a first Physical Uplink Control Channel (PUCCH) format and a first PUCCH resource for transmitting the first UCI, and determine a second PUCCH format and a second PUCCH resource for transmitting the second UCI. The UE may transmit the first UCI using the first PUCCH format and the first PUCCH resource, and transmit the second UCI using the second PUCCH format and the second PUCCH resource. At this time, the first UCI may be transmitted to the NR base station, and the second UCI may be transmitted to the LTE base station.

As another example, the first UCI and the second UCI may be transmitted through the same Physical Uplink Control Channel (PUCCH) resource. In this case, the two UCIs may be transmitted to the NR base station or the LTE base station as they are transmitted through one PUCCH resource or PUCCH format.

In the example above, if the sum of the bit sizes of the first UCI and the second UCI is less than or equal to 22 bits, the first UCI and the second UCI may be transmitted using PUCCH format 3, by applying Reed-Muller (RM) coding thereto. At this time, an input bit stream of the PUCCH format 3 may be configured by arranging the first UCI before or after the second UCI in the time dimension.

Alternatively, if the sum of the bit sizes of the first UCI and the second UCI is greater than 22 bits, the first UCI and the second UCI may be transmitted by applying tail biting convolutional coding (TBCC) thereto.

As another example, when the UE transmits the first UCI and the second UCI in a time interval in which simultaneous transmission of the physical uplink control channel (PUCCH) and a physical uplink shared channel (PUSCH) is configured, the UE may piggyback the first UCI and the second UCI on the PUSCH according to different mapping rules.

As another example, when the UE transmits the first UCI and the second UCI in a time interval in which simultaneous transmission of the PUCCH and the PUSCH is configured, the UE may transmit the first UCI on the PUCCH and transmit the second UCI by piggybacking the second UCI on the PUSCH.

Since each embodiment of the above-described proposed method can be considered as one method for implementing the present invention, it is apparent that each embodiment can be regarded as a proposed method. In addition, the present invention can be implemented not only using the proposed methods independently but also by combining (or merging) some of the proposed methods. In addition, it is possible to define a rule that information on whether the proposed methods are applied (or information on rules related to the proposed methods) should be transmitted from the eNB to the UE through a predefined signal (e.g., physical layer signal, higher layer signal, etc.).

4. Device Configuration

Figure 23:
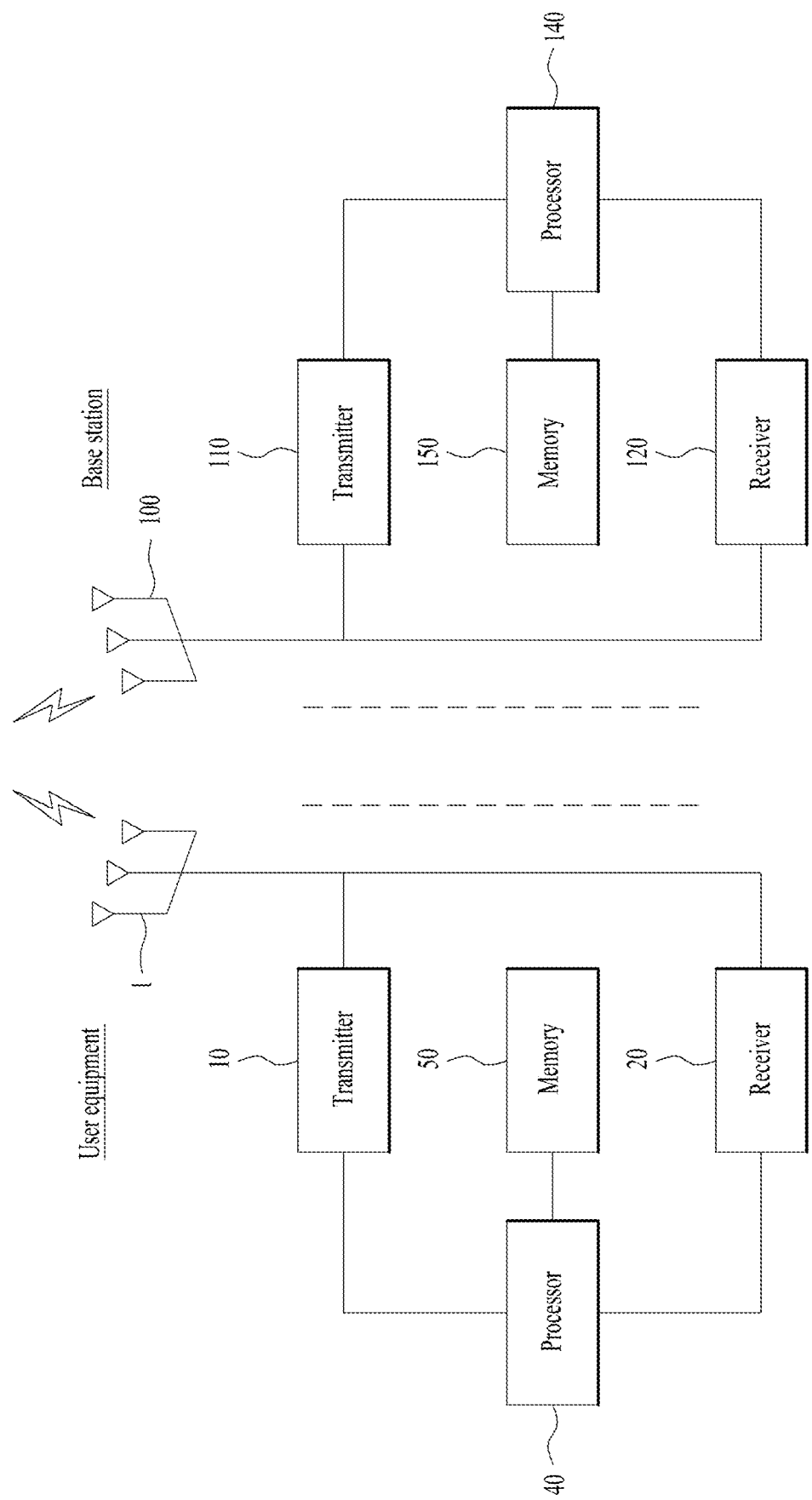
FIG. 23 is a diagram illustrating configurations of a terminal and a base station capable of being implemented by the embodiments proposed in the present invention.

FIG. 23 is a diagram illustrating configurations of a UE and a base station capable of being implemented by the embodiments proposed in the present invention. The UE and the base station shown in FIG. 23 operate to implement the embodiments of the method for transmitting the UCI between the terminal and the base station described above.

A UE 1 may act as a transmission end on a UL and as a reception end on a DL. A base station (eNB or gNB) 100 may act as a reception end on a UL and as a transmission end on a DL.

Here, it may be easily understood by those skilled in the art that, when the UE 1 according to the present invention transmits and receives signals to and from two different base stations (eNB and gNB), the base station 100 of FIG. 23 may operate as an eNB Or gNB depending on the transmission/reception scheme of each signal.

That is, each of the UE and the base station may include a Transmitter (Tx) 10 or 110 and a Receiver (Rx) 20 or 120, for controlling transmission and reception of information, data, and/or messages, and an antenna 30 or 130 for transmitting and receiving information, data, and/or messages.

Each of the UE and the base station may further include a processor 40 or 140 for implementing the afore-described embodiments of the present disclosure and a memory 50 or 150 for temporarily or permanently storing operations of the processor 40 or 140.

The UE 1 configured as described above may receive a first DL signal and a second DL signal from the LTE base station 100 and the NR base station 100, respectively, which are dual-connected to each other.

Subsequently, the UE 1 may transmit first UCI corresponding to the first DL signal and second UCI corresponding to the second DL signal using a carrier shared by the LTE base station 100 and the NR base station 100. For example, the first UCI and the second UCI may be transmitted in the TDM/FDM scheme, transmitted through the same PUCCH resource, or piggybacked and transmitted on the PUSCH according to different mapping rules, or one of the two UCIs may be transmitted on the PUCCH and the other may be piggybacked and transmitted on the PUSCH.

The Tx and Rx of the UE and the base station may perform a packet modulation/demodulation function for data transmission, a high-speed packet channel coding function, OFDM packet scheduling, TDD packet scheduling, and/or channelization. Each of the UE and the base station of FIG. 23 may further include a low-power Radio Frequency (RF)/Intermediate Frequency (IF) module.

Meanwhile, the UE may be any of a Personal Digital Assistant (PDA), a cellular phone, a Personal Communication Service (PCS) phone, a Global System for Mobile (GSM) phone, a Wideband Code Division Multiple Access (WCDMA) phone, a Mobile Broadband System (MBS) phone, a hand-held PC, a laptop PC, a smart phone, a Multi Mode-Multi Band (MM-MB) terminal, etc.

The smart phone is a terminal taking the advantages of both a mobile phone and a PDA. It incorporates the functions of a PDA, that is, scheduling and data communications such as fax transmission and reception and Internet connection into a mobile phone. The MB-MM terminal refers to a terminal which has a multi-modem chip built therein and which can operate in any of a mobile Internet system and other mobile communication systems (e.g. CDMA 2000, WCDMA, etc.).

Embodiments of the present disclosure may be achieved by various means, for example, hardware, firmware, software, or a combination thereof In a hardware configuration, the methods according to exemplary embodiments of the present disclosure may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the methods according to the embodiments of the present disclosure may be implemented in the form of a module, a procedure, a function, etc. performing the above-described functions or operations. A software code may be stored in the memory 50 or 150 and executed by the processor 40 or 140. The memory is located at the interior or exterior of the processor and may transmit and receive data to and from the processor via various known means.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein. It is obvious to those skilled in the art that claims that are not explicitly cited in each other in the appended claims may be presented in combination as an embodiment of the present disclosure or included as a new claim by a subsequent amendment after the application is filed.

INDUSTRIAL APPLICABILITY

The present disclosure is applicable to various wireless access systems including a 3GPP system, and/or a 3GPP2 system. Besides these wireless access systems, the embodiments of the present disclosure are applicable to all technical fields in which the wireless access systems find their applications. Moreover, the proposed method can also be applied to mmWave communication using an ultra-high frequency band.

The invention claimed is:

1. A method for transmitting uplink control information by a user equipment in a wireless communication system comprising a first base station and a second base station connected to the first base station on a manner of dual connectivity, the method comprising:
receiving a first downlink signal from the first base station and a second downlink signal from the second base station; and
transmitting first uplink control information corresponding to the first downlink signal and second uplink control information corresponding to the second downlink signal using a carrier shared by the first base station and the second base station,
wherein the first uplink control information and the second uplink control information are transmitted through an identical Physical Uplink Control Channel (PUCCH) resource.

2. The method according to claim 1,
wherein, based on a sum of bit sizes of the first uplink control information and the second uplink control information being less than or equal to 22 bits, the first uplink control information and the second uplink control information are transmitted based on PUCCH format 3 by applying Reed-Muller (RM) coding.

3. The method according to claim 2,
wherein an input bit stream of the PUCCH format 3 is configured by arranging the first uplink control information before or after the second uplink control information in a time domain.

4. The method according to claim 1,
wherein, based on a sum of bit sizes of the first uplink control information and the second uplink control information being greater than 22 bits, the first uplink control information and the second uplink control information are transmitted by applying tail biting convolutional coding (TBCC).

5. The method according to claim 1,
wherein the first base station is a New RAT (NR) base station and the second base station is a Long Term Evolution (LTE) base station.

6. The method according to claim 5,
wherein the NR base station operates in time division duplex (TDD), and
wherein the LTE base station operates in frequency division duplex (FDD).

7. The method according to claim 1, wherein the first base station is connected to the second base station through a non-ideal backhaul.

8. A user equipment configured to transmit uplink control information in a wireless communication system comprising a first base station and a second base station connected to the first base station on a manner of dual connectivity, the user equipment comprising:
a transmitter;
a receiver; and
a processor connected to the transmitter and the receiver to operate,
wherein the processor is configured to:
receive a first downlink signal from the first base station and a second downlink signal from the second base station; and
transmit first uplink control information corresponding to the first downlink signal and second uplink control information corresponding to the second downlink signal using a carrier shared by the first base station and the second base station,
wherein the first uplink control information and the second uplink control information are transmitted through an identical Physical Uplink Control Channel (PUCCH) resource.

9. The user equipment according to claim 8,
wherein, based on a sum of bit sizes of the first uplink control information and the second uplink control information being less than or equal to 22 bits, the first uplink control information and the second uplink control information are transmitted based on PUCCH format 3 by applying Reed-Muller (RM) coding.

10. The user equipment according to claim 9,
wherein an input bit stream of the PUCCH format 3 is configured by arranging the first uplink control information before or after the second uplink control information in a time domain.

11. The user equipment according to claim 8,
wherein, based on a sum of bit sizes of the first uplink control information and the second uplink control information being greater than 22 bits, the first uplink control information and the second uplink control information are transmitted by applying tail biting convolutional coding (TBCC).

12. The user equipment according to claim 8,
wherein the first base station is a New RAT (NR) base station and the second base station is a Long Term Evolution (LTE) base station.

13. The user equipment according to claim 12,
wherein the NR base station operates in time division duplex (TDD), and
wherein the LTE base station operates in frequency division duplex (FDD).

14. The user equipment according to claim 8, wherein the first base station is connected to the second base station through a non-ideal backhaul.

* * * * *